US011222954B2

(12) United States Patent
Cui et al.

(10) Patent No.: US 11,222,954 B2
(45) Date of Patent: Jan. 11, 2022

(54) THREE-DIMENSIONAL MEMORY DEVICE CONTAINING INTER-SELECT-GATE ELECTRODES AND METHODS OF MAKING THE SAME

(71) Applicant: SANDISK TECHNOLOGIES LLC, Addison, TX (US)

(72) Inventors: Zhixin Cui, Nagoya (JP); Hardwell Chibvongodze, Hiratsuka (JP); Masatoshi Nishikawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/828,129

(22) Filed: Mar. 24, 2020

(65) Prior Publication Data

US 2021/0305384 A1    Sep. 30, 2021

(51) Int. Cl.
*G11C 11/34*     (2006.01)
*H01L 29/423*    (2006.01)
(Continued)

(52) U.S. Cl.
CPC ...... *H01L 29/4234* (2013.01); *G11C 16/0483* (2013.01); *G11C 16/10* (2013.01);
(Continued)

(58) Field of Classification Search
CPC ........... H01L 27/11565; H01L 29/4234; H01L 29/40117; H01L 27/11582; G11C 16/0483; G11C 16/10; G11C 16/14; G11C 16/26
(Continued)

(56) References Cited

U.S. PATENT DOCUMENTS 5,915,167 A      6/1999   Leedy
8,334,561 B2 *  12/2012   Fukuzumi .......... G11C 16/0483
                                                        257/326
(Continued)

FOREIGN PATENT DOCUMENTS

KR    0-2012-0110452 A    10/2012
KR   10-2016-0131458 A    11/2016
(Continued)

OTHER PUBLICATIONS

Notification of Transmittal of the International Search Report and Written Opinion of the International Search Authority for International Patent Application No. PCT/US2020/039068, dated Dec. 11, 2020, 9 pages.

(Continued)

*Primary Examiner* — Viet Q Nguyen
(74) *Attorney, Agent, or Firm* — The Marbury Law Group PLLC

(57)    ABSTRACT

A three-dimensional memory device includes an alternating stack of word-line-isolation insulating layers and word-line-level electrically conductive layers located over a substrate, a plurality of drain-select-level electrodes that are laterally spaced apart from each other overlying the alternating stack, memory stack structures containing a respective vertical semiconductor channel laterally surrounded by a respective memory film and vertically extending through the alternating stack and the plurality of drain-select-level electrodes, inter-select-gate electrodes located between a respective neighboring pair of the drain-select-level electrodes, and inter-select-gate dielectrics located between each of the inter-select-gate electrodes and a neighboring one of the drain-select-level electrodes. The inter-select-gate electrodes are not electrically connected to the drain-select-level electrodes.

14 Claims, 39 Drawing Sheets

(51) Int. Cl.
*H01L 27/11582* (2017.01)
*H01L 29/417* (2006.01)
*H01L 21/28* (2006.01)
*G11C 16/10* (2006.01)
*G11C 16/14* (2006.01)
*G11C 16/26* (2006.01)
*G11C 16/04* (2006.01)
*H01L 27/11565* (2017.01)

(52) U.S. Cl.
CPC .............. *G11C 16/14* (2013.01); *G11C 16/26* (2013.01); *H01L 27/11582* (2013.01); *H01L 29/40117* (2019.08); *H01L 29/41741* (2013.01); *H01L 27/11565* (2013.01)

(58) Field of Classification Search
USPC ................................................ 365/63, 185.05
See application file for complete search history.

(56) References Cited

U.S. PATENT DOCUMENTS

| | | | | |
|---|---|---|---|---|
| 8,569,826 | B2* | 10/2013 | Kidoh | H01L 27/11582 257/324 |
| 10,373,969 | B2 | 8/2019 | Zhang et al. | |
| 10,475,804 | B1 | 11/2019 | Nishikawa et al. | |
| 10,600,800 | B2 | 3/2020 | Nishikawa et al. | |
| 11,088,252 | B2* | 8/2021 | Kasai | H01L 29/518 |
| 11,094,704 | B2* | 8/2021 | Zhang | H01L 27/11573 |
| 11,094,715 | B2* | 8/2021 | Cui | H01L 29/0847 |
| 2015/0008503 | A1* | 1/2015 | Makala | H01L 21/8221 257/324 |
| 2019/0214395 | A1* | 7/2019 | Zhang | G11C 16/0483 |
| 2019/0326306 | A1 | 10/2019 | Mushiga et al. | |
| 2019/0326307 | A1 | 10/2019 | Mushiga et al. | |
| 2019/0326313 | A1* | 10/2019 | Cui | H01L 29/40117 |
| 2020/0006358 | A1* | 1/2020 | Nishikawa | H01L 21/76897 |
| 2020/0058673 | A1 | 2/2020 | Nishikawa et al. | |

FOREIGN PATENT DOCUMENTS

| | | |
|---|---|---|
| KR | 10-2018-0138403 A | 12/2018 |
| WO | WO2018-067250 A1 | 4/2018 |
| WO | WO2019-055075 A1 | 3/2019 |

OTHER PUBLICATIONS

Endoh, T et al., "Novel Ultra High Density Flash Memory with A Stacked-Surrounding Gate Transistor (S-GT) Structured Cell," IEDM Proc., pp. 33-36, (2001).

U.S. Appl. No. 16/267,592, filed Feb. 5, 2019, SanDisk Technologies LLC.

U.S. Appl. No. 16/267,625, filed Feb. 5, 2019, SanDisk Technologies LLC.

U.S. Appl. No. 16/361,722, filed Mar. 22, 2019, SanDisk Technologies LLC.

\* cited by examiner

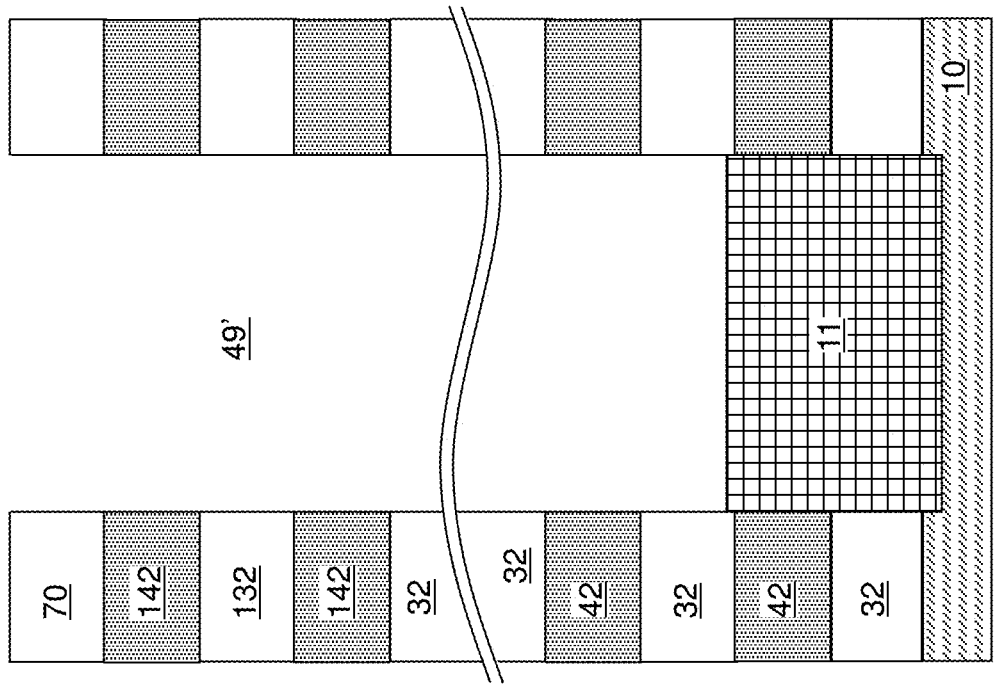
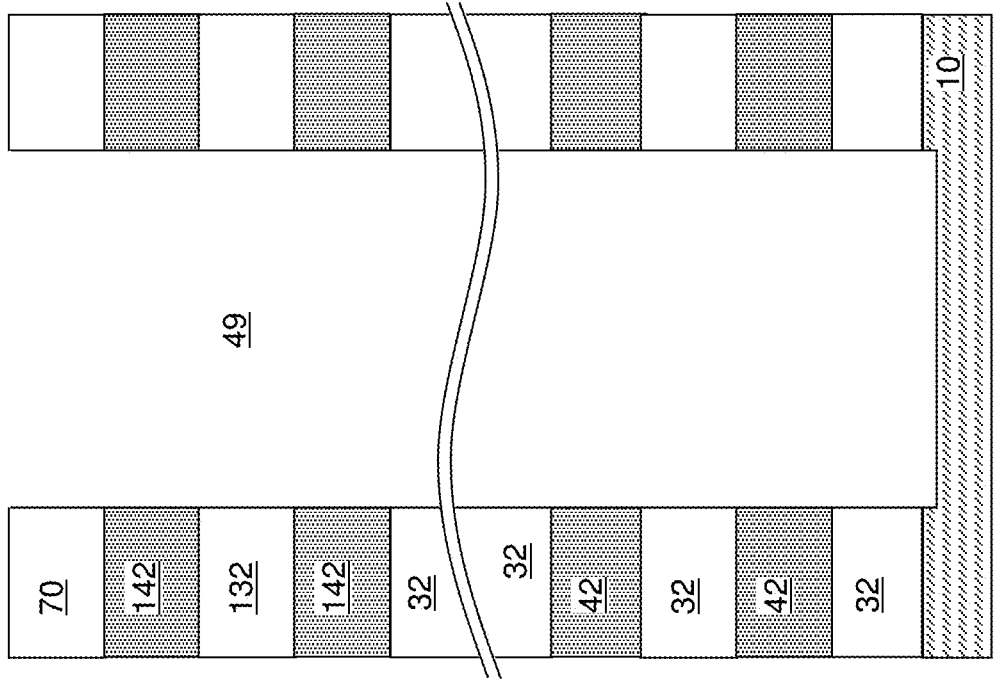

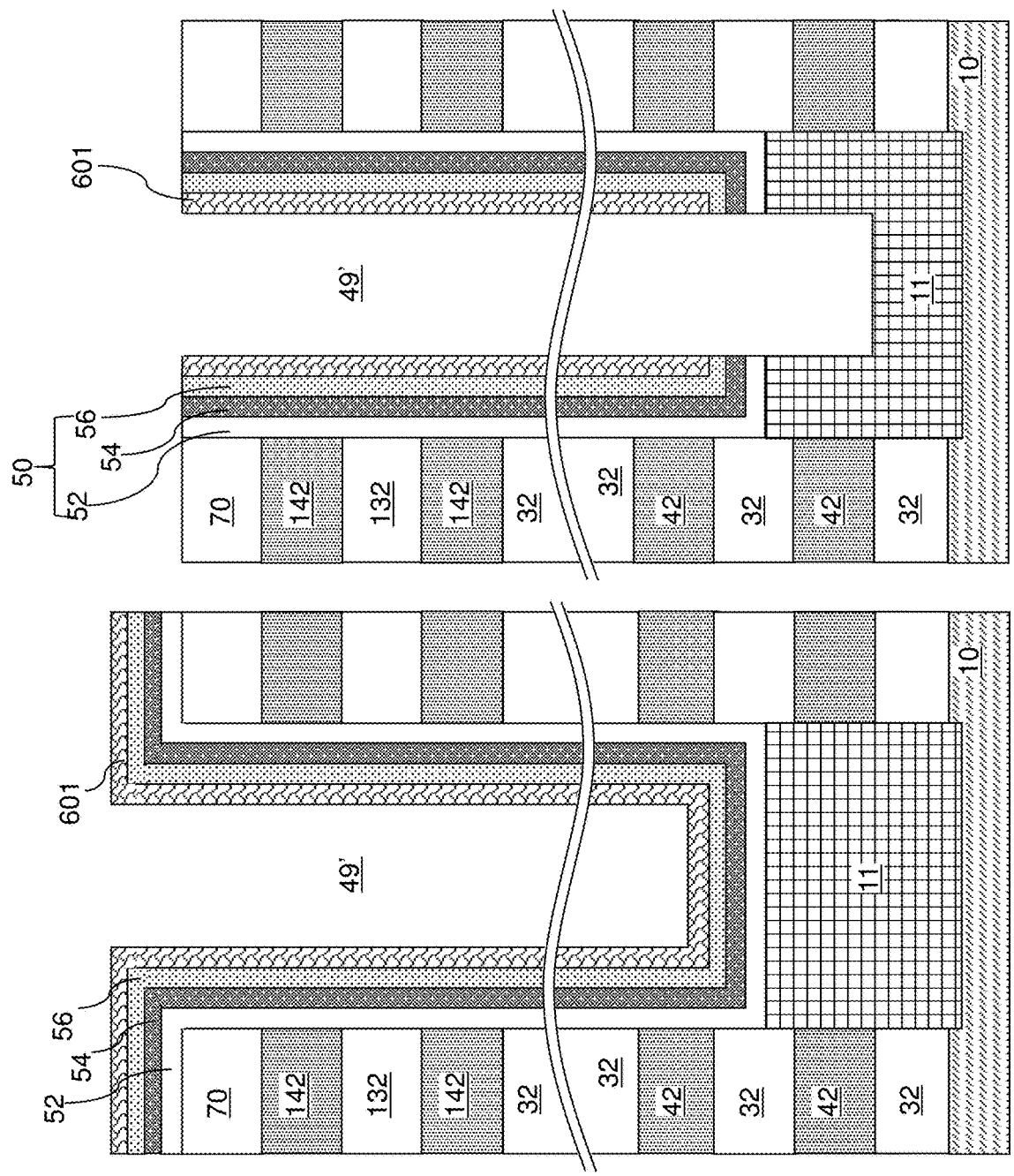

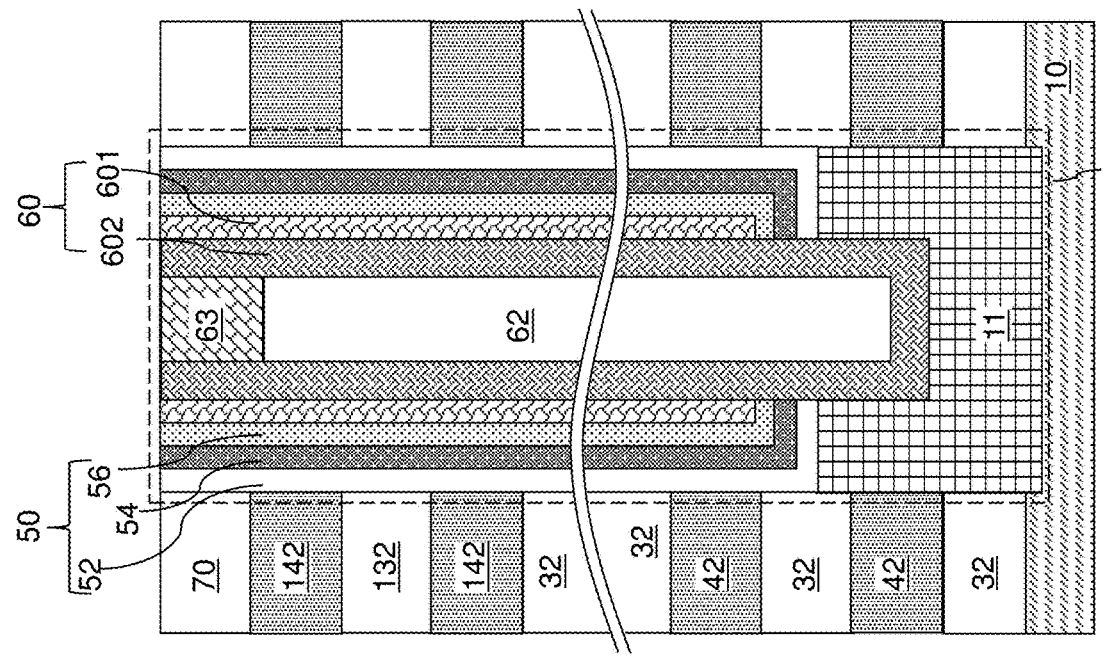
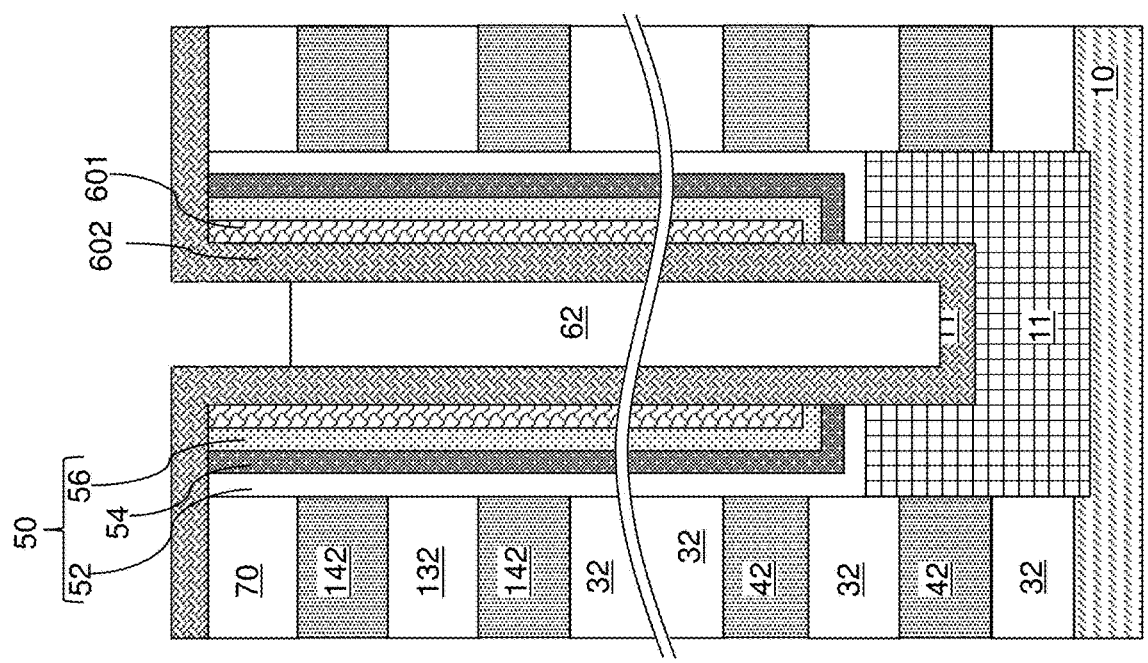
FIG. 7H
FIG. 7G

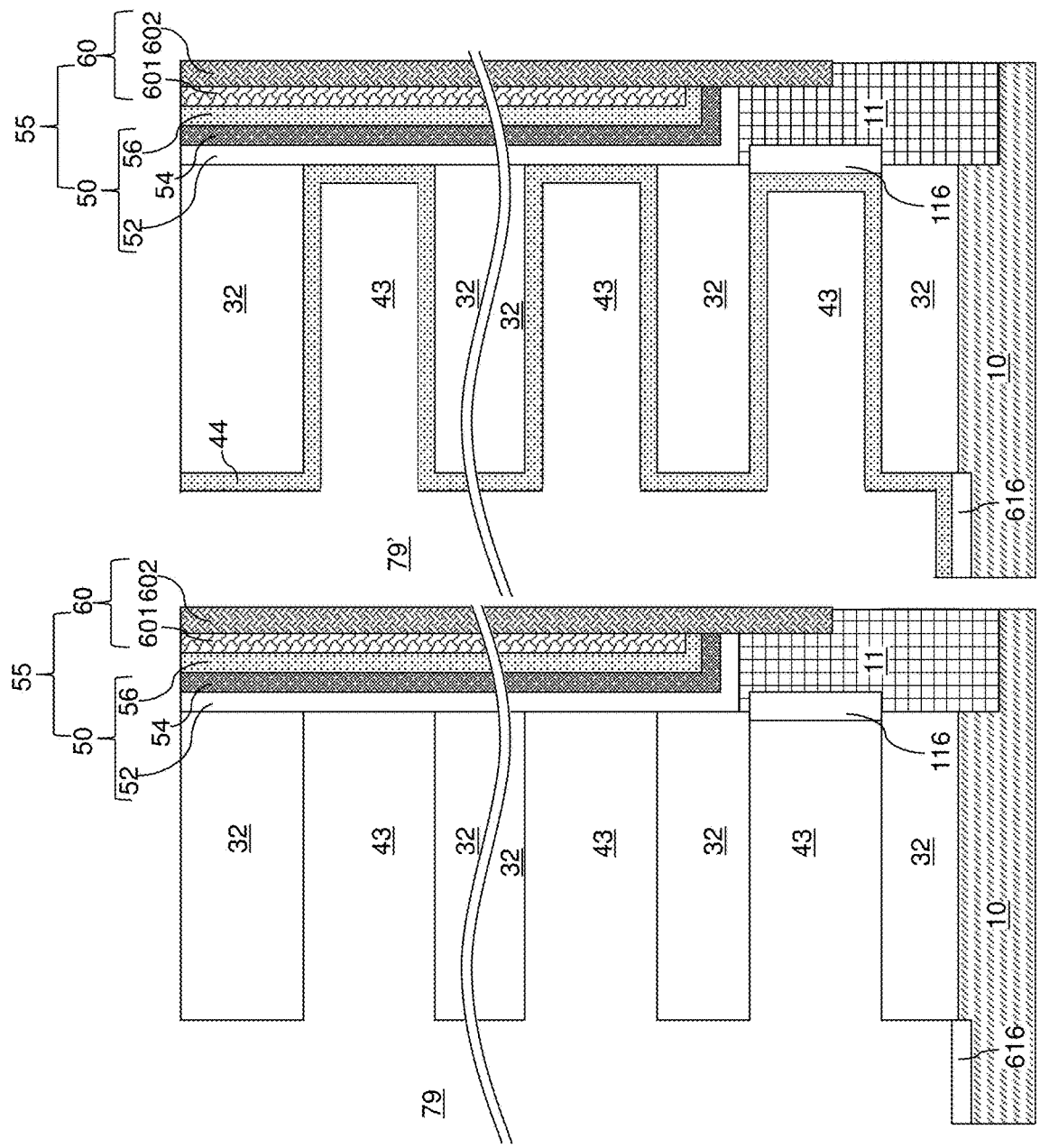

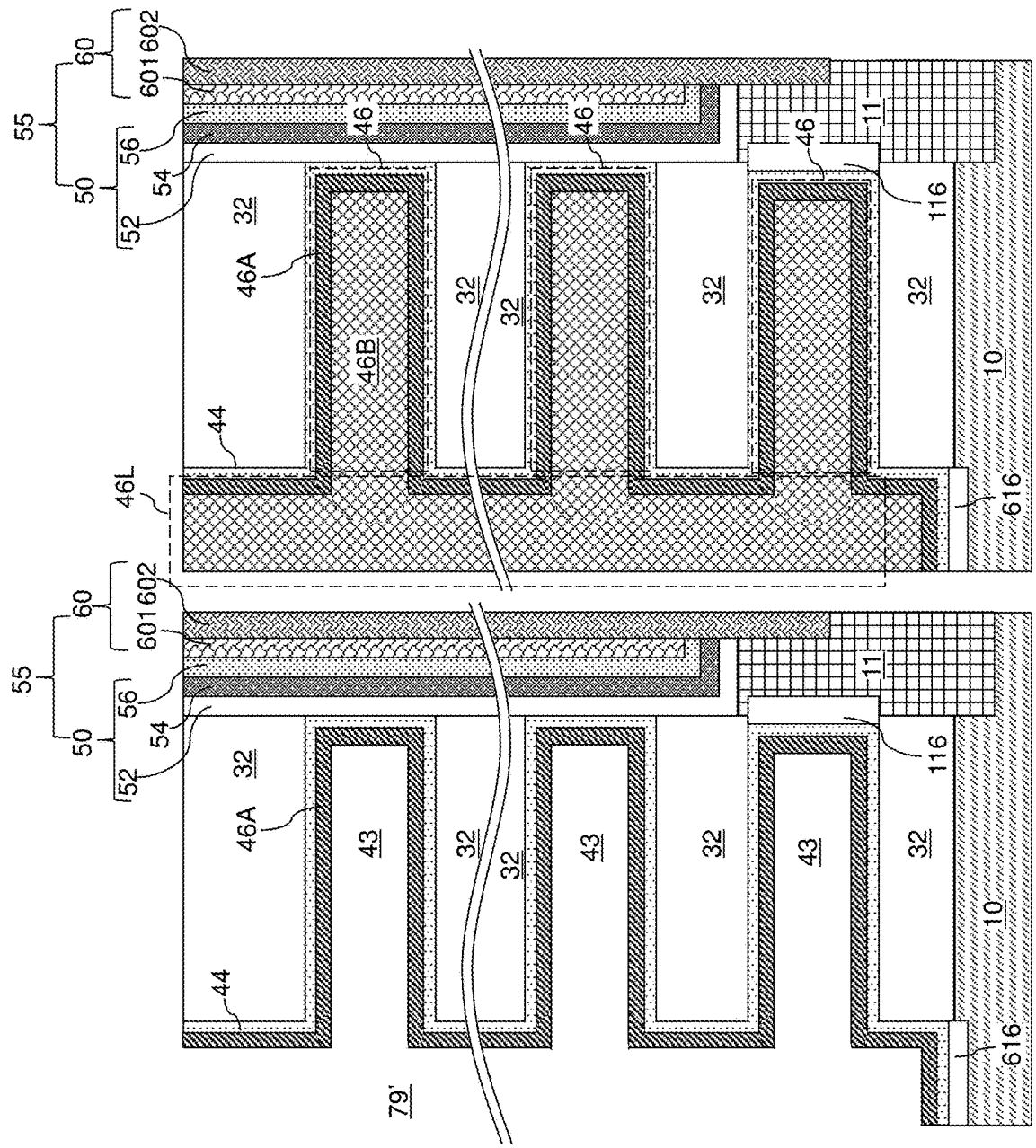

THREE-DIMENSIONAL MEMORY DEVICE CONTAINING INTER-SELECT-GATE ELECTRODES AND METHODS OF MAKING THE SAME

FIELD

The present disclosure relates generally to the field of semiconductor devices, and particular to a three-dimensional memory device including inter-select-gate electrodes and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an aspect of the present disclosure, a three-dimensional memory device includes an alternating stack of word-line-isolation insulating layers and word-line-level electrically conductive layers located over a substrate, a plurality of drain-select-level electrodes that are laterally spaced apart from each other overlying the alternating stack, memory stack structures containing a respective vertical semiconductor channel laterally surrounded by a respective memory film and vertically extending through the alternating stack and the plurality of drain-select-level electrodes, inter-select-gate electrodes located between a respective neighboring pair of the drain-select-level electrodes, and inter-select-gate dielectrics located between each of the inter-select-gate electrodes and a neighboring one of the drain-select-level electrodes. The inter-select-gate electrodes are not electrically connected to the drain-select-level electrodes.

According to another aspect of the present disclosure, a method of forming a three-dimensional memory device is provided, which comprises: forming an alternating stack of word-line-isolation insulating layers and sacrificial material layers, wherein the sacrificial material layers comprise word-line-level sacrificial material layers and at least one drain-select-level sacrificial material layer; forming sacrificial drain-select-level strips laterally extending along a first horizontal direction through the at least one drain-select-level sacrificial material layer, wherein the at least one drain-select-level sacrificial material layer is divided into drain-select-level sacrificial material plates; forming memory openings through the sacrificial drain-select-level strips and the alternating stack, wherein a first subset of the memory openings is formed through sidewalls of the sacrificial drain-select-level strips; forming memory stack structures in the memory openings, wherein the memory stack structures comprise a respective vertical semiconductor channel and a respective memory film; forming drain-select-level slit trenches by removing the sacrificial drain-select-level strips; replacing the word-line-level sacrificial material layers and the drain-select-level sacrificial material plates with word-line-level electrically conductive layers and drain-select-level electrodes; and forming a combination of an inter-select-gate dielectric and an inter-select-gate electrode in each of the drain-select-level slit trenches. The inter-select-gate electrodes are not electrically connected to the drain-select-level electrodes.

BRIEF DESCRIPTION OF THE DRAWINGS

FIGS. 7A-7H are sequential vertical cross-sectional views of a memory opening during formation of a memory opening fill structure according to an embodiment of the present disclosure.

FIGS. 11A-11D are sequential vertical cross-sectional view of a region of the exemplary structure during formation of electrically conductive layers according to an embodiment of the present disclosure.

DETAILED DESCRIPTION

Figure 1:
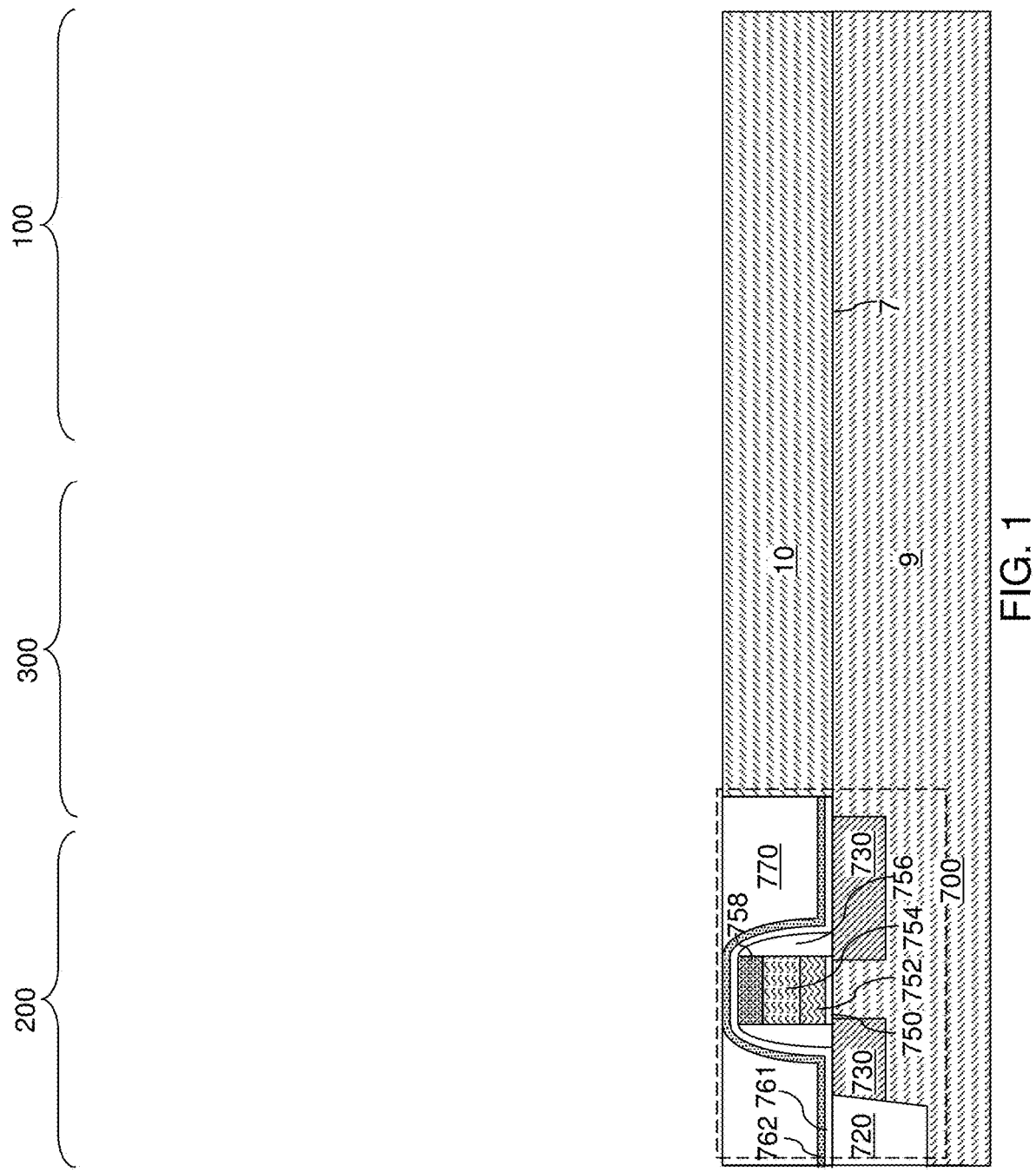
FIG. 1 is a vertical cross-sectional view of an exemplary structure after formation of at least one peripheral device and a semiconductor material layer according to an embodiment of the present disclosure.

As discussed above, the present disclosure is directed to a three-dimensional memory device including inter-select-gate electrodes and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements. Terms of standard mathematical set theory apply in this disclosure (express or implied in the specification, the claims, and the drawings) with the modification that a set or a subset refers to a non-empty set. In other words, all sets or subsets are presumed to include at least one element unless expressly stated otherwise. Consequently, a subset of a set refers to all possible subsets of the set other than the empty set. For example, a set of N elements has $2^N-1$ number of non-empty subsets, which are collectively referred to as the subsets of the set. An element "selected from" a list of candidates means that the element may be any single one of the candidates. For example, an element "selected from" A, B, and C means that the element may be A, may be B, or may be C. At least one element "selected from" a list of candidates means that the element may be any non-empty subset among all possible mathematical subsets of the list of candidates. For example, at least one element "selected from" A, B, and C means that any non-empty subset of the set of A, B, and C may be employed as the at least one element.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10.

The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants.

Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate dielectric cap layer can be formed over the substrate semiconductor layer 9, and can be subsequently patterned to form at least one gate structure (750, 752, 754, 758), each of which can include a gate dielectric 750, a gate electrode (752, 754), and a gate dielectric cap 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200. In an alternative embodiment, the at least one semiconductor device (e.g., peripheral or driver circuit device) 700 may be formed in or on the substrate 9 in the memory array region 100 under the memory array to be formed in a CMOS under array configuration. In another alternative embodiment, the at least one semiconductor device (e.g., peripheral or driver circuit device) 700 may be formed in or on a separate substrate and then bonded to the memory array located on the substrate 9 in a CMOS bonded to array configuration.

Figure 2:
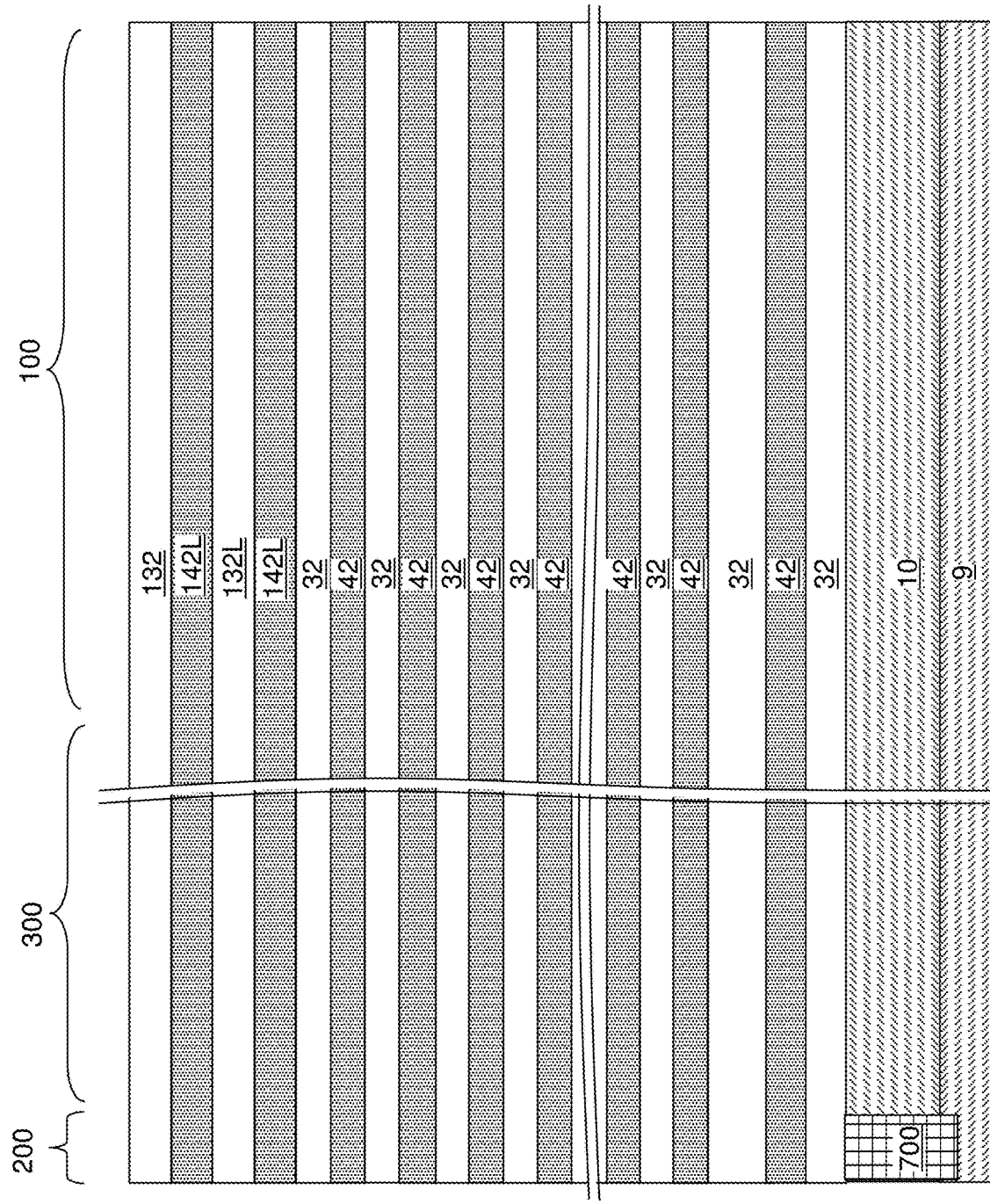
FIG. 2 is a vertical cross-sectional view of the exemplary structure after formation of an alternating stack of word-line-isolation insulating layers and sacrificial material layers according to an embodiment of the present disclosure.

Referring to FIG. 2, a stack of an alternating plurality of first material layers (which can be word-line-isolation insulating layers 32) and second material layers (which can be word-line-level sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. As used herein, a "word-line-level" element refers to an element that is formed at, or adjacent to, any of the word line levels, i.e., at any of the levels at which a word line is to be subsequently formed.

Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an word-line-isolation insulating layer 32, and each second material layer can be a word-line-level sacrificial material layer. The word-line-isolation insulating layers 32 are formed between word line levels, i.e., levels at which word lines are to be subsequently formed. In this case, the stack can include an alternating plurality of word-line-isolation insulating layers 32 and word-line-level sacrificial material layers 42, and constitutes a prototype stack of alternating layers comprising word-line-isolation insulating layers 32 and word-line-level sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42), or as a word-line-level alternating stack (32, 42). In one embodiment, the alternating stack (32, 42) can include word-line-isolation insulating layers 32 composed of the first material, and word-line-level sacrificial material layers 42 composed of a second material different from that of word-line-isolation insulating layers 32. The first material of the word-line-isolation insulating layers 32 can be at least one insulating material. As such, each word-line-isolation insulating layer 32 can be an insulating material layer. Insulating materials that can be employed for the word-line-isolation insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the word-line-isolation insulating layers 32 can be silicon oxide. The alternating stack (32, 42) may begin with a bottommost one of the word-line-isolation insulating layer 32 and terminate with a topmost one of the word-line-isolation insulating layer 32.

The second material of the word-line-level sacrificial material layers 42 is a sacrificial material that can be removed selective to the first material of the word-line-isolation insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The word-line-level sacrificial material layers 42 may comprise an insulating material, a semiconductor material, or a conductive material. The second material of the word-line-level sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the word-line-level sacrificial material layers 42 can be word-line-level spacer material layers that comprise silicon nitride or a semiconductor material including at least one of silicon and germanium.

In one embodiment, the word-line-isolation insulating layers 32 can include silicon oxide, and word-line-level sacrificial material layers can include silicon nitride word-line-level sacrificial material layers. The first material of the word-line-isolation insulating layers 32 can be deposited, for example, by chemical vapor deposition (CVD). For example, if silicon oxide is employed for the word-line-isolation insulating layers 32, tetraethylorthosilicate (TEOS) can be employed as the precursor material for the CVD process. The second material of the word-line-level sacrificial material layers 42 can be formed, for example, CVD or atomic layer deposition (ALD).

The thicknesses of the word-line-isolation insulating layers 32 and the word-line-level sacrificial material layers 42 can be in a range from 20 nm to 50 nm, although lesser and greater thicknesses can be employed for each word-line-isolation insulating layer 32 and for each word-line-level sacrificial material layer 42. The number of repetitions of the pairs of an word-line-isolation insulating layer 32 and a word-line-level sacrificial material layer (e.g., a control gate electrode or a word-line-level sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each word-line-level sacrificial material layer 42 in the alternating stack (32, 42) can have a uniform thickness that is substantially invariant within each respective word-line-level sacrificial material layer 42.

At least one drain-select-level sacrificial material layer 142L and at least one drain-select-level insulating layer 132L can be formed over the alternating stack (32, 42). As used herein, a "drain-select-level" element refers to an element that is formed at, or adjacent to, any of the drain select levels, i.e., at any of the levels at which a drain select gate electrode is to be subsequently formed. In one embodiment, a plurality of drain-select-level sacrificial material layers 142L and at least one drain-select-level insulating layer 132L may be formed over the alternating stack (32, 42). In this case, the plurality of drain-select-level sacrificial material layers 142L and the at least one drain-select-level insulating layer 132L may vertically alternate. In one embodiment, a plurality of drain-select-level sacrificial material layers 142L and a plurality of drain-select-level insulating layers 132L may be vertically alternate. The total number of drain-select-level sacrificial material layers 142L may be in a range from 2 to 10, such as from 2 to 4. The drain-select-level sacrificial material layers 142L are vertically spaced among one another by the drain-select-level insulating layers 132L. In one embodiment, the drain-select-level insulating layers 132L can include the same material as the word-line-isolation insulating layers 32, and the drain-select-level sacrificial material layers 142L can include the same material as the word-line-level sacrificial material layers 42. In one embodiment, the drain-select-level insulating layers 132L and the word-line-isolation insulating layers 32 can include undoped silicate glass or a doped silicate glass, and the drain-select-level sacrificial material layers 142L and the word-line-level sacrificial material layers 42 can include silicon nitride. The thickness of each drain-select-level insulating layer 132L other than the topmost one and the thickness of each drain-select-level sacrificial material layer 142L can be in a range from 20 nm to 50 nm, although lesser and greater thicknesses can also be employed. The set of all drain-select-level insulating layers 132L and all drain-select-level sacrificial material layers 142L is herein referred to as a drain-select-level alternating stack (132L, 142L).

An insulating cap layer 70 can be formed on the top surface of a topmost one of the drain-select-level sacrificial material layers 142L. The insulating cap layer 70 may include the same material as the word-line-isolation insulating layers 32 and the drain-select-level insulating layers 132L. For example, the insulating cap layer 70 can include undoped silicate glass or doped silicate glass. The insulating cap layer 70 may have a thickness in a range from 40 nm to 200 nm, although lesser and greater thicknesses can also be employed.

Figure 3A:
FIG. 3A is a vertical cross-sectional view of the exemplary structure after formation of stepped terraces and a retro-stepped dielectric material portion according to an embodiment of the present disclosure.
Figure 3B:
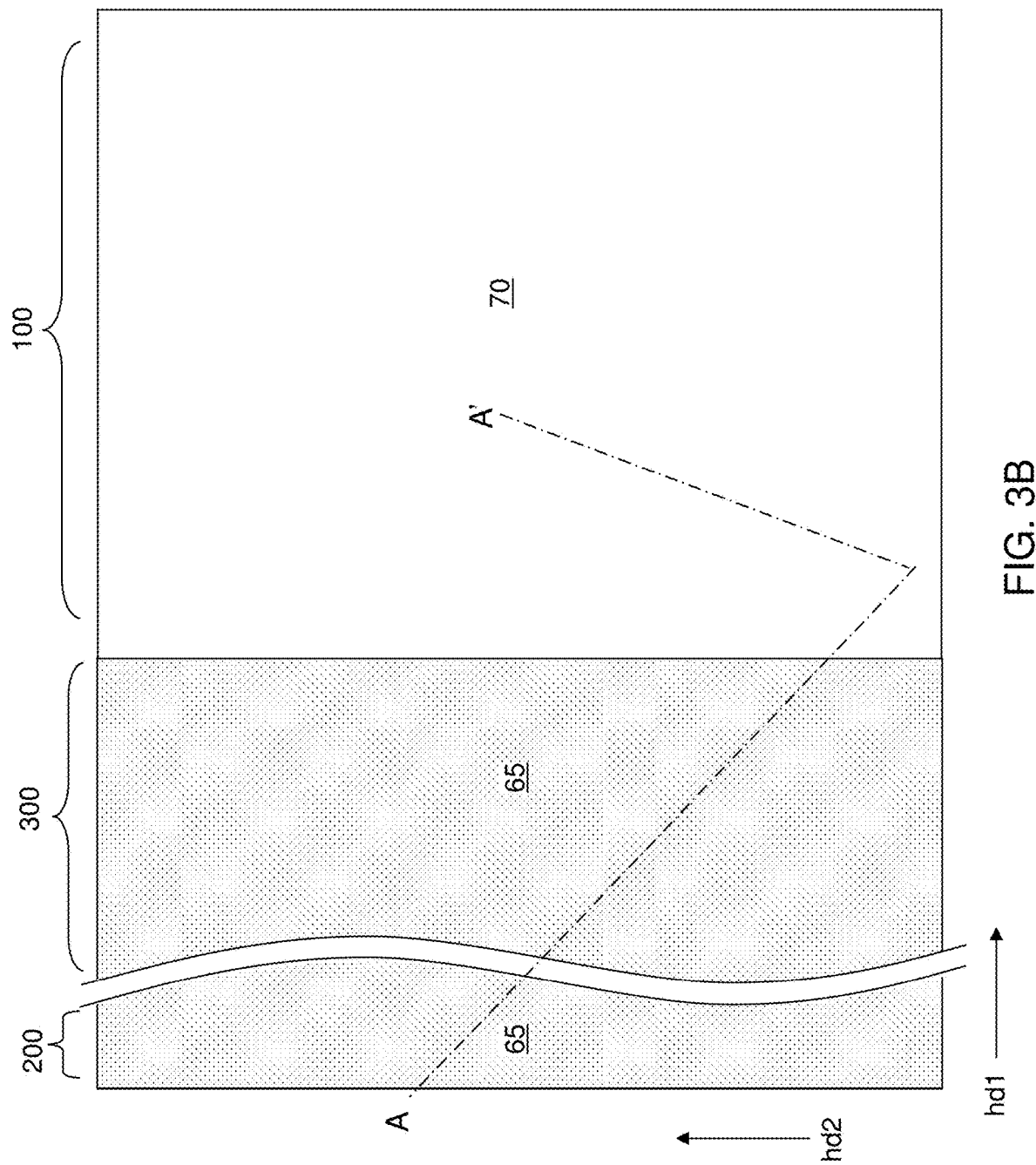
FIG. 3B is a top-down view of the exemplary structure along the vertical plane B-B' of FIG. 3A. The horizontal plane B-B' is the plane of the horizontal cross-sectional view of FIG. 3A.

Referring to FIGS. 3A and 3B, a stepped cavity can be formed within the staircase region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the drain-select-level alternating stack (132L, 142L) and the alternating stack (32, 42). Each word-line-level sacrificial material layer 42 other than a topmost word-line-level sacrificial material layer 42 within the alternating stack (32, 42) laterally extends farther than any overlying word-line-level sacrificial material layer 42 within the alternating stack (32, 42). Each drain-select-level sacrificial material layer 142L can have a lateral extent less than the topmost word-line-level sacrificial material layer 42. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the topmost surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. The retro-stepped dielectric material portion 65 can be laterally offset from the memory array region 100 along a first horizontal direction hd1, and the vertical steps of the stepped surfaces can laterally extend along a second horizontal direction hd2 that is perpendicular to the first horizontal direction hd1.

Figure 4A:
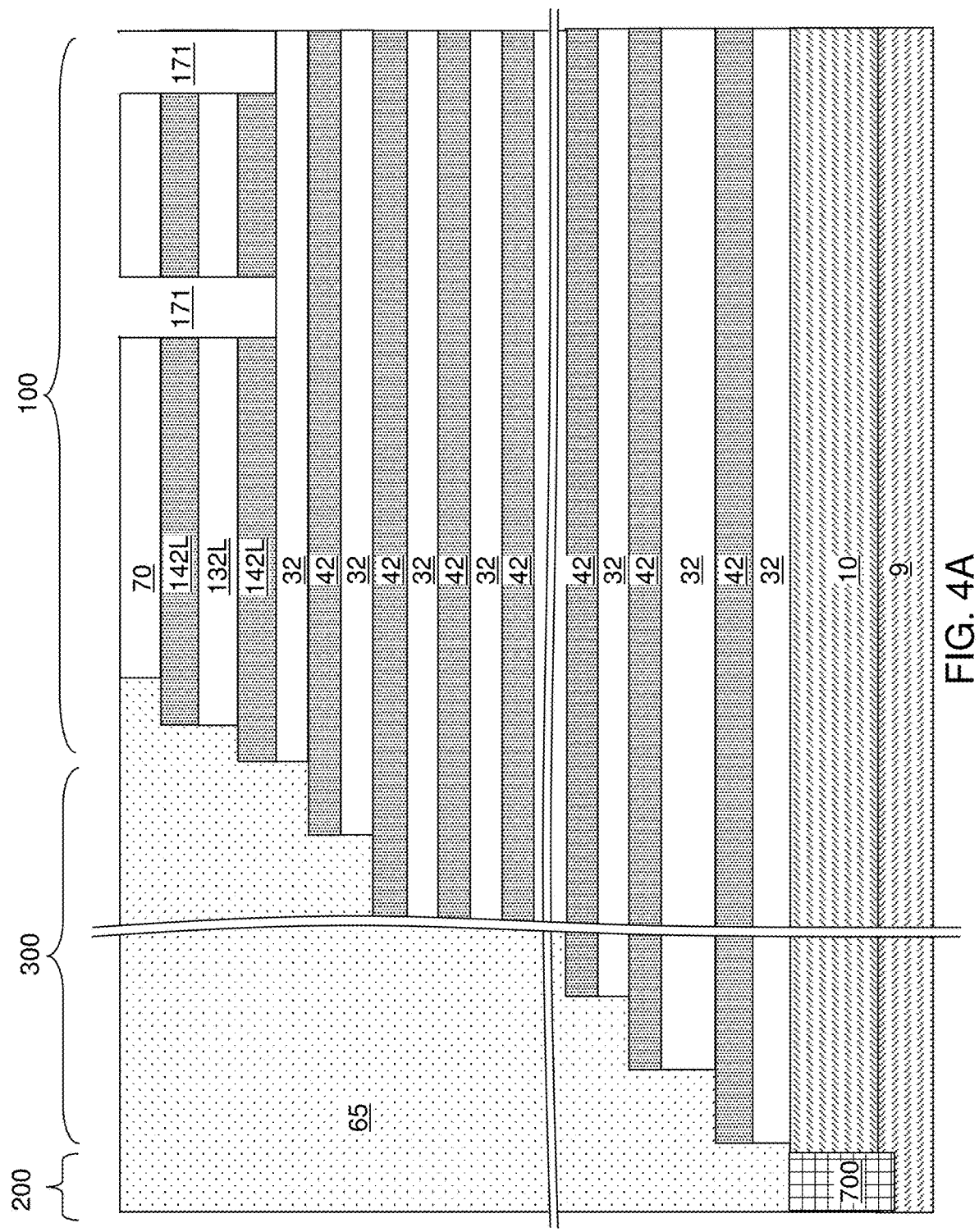
FIG. 4A is a horizontal cross-sectional view of the exemplary structure after formation of drain-select-level slit trenches according to an embodiment of the present disclosure.
Figure 4B:
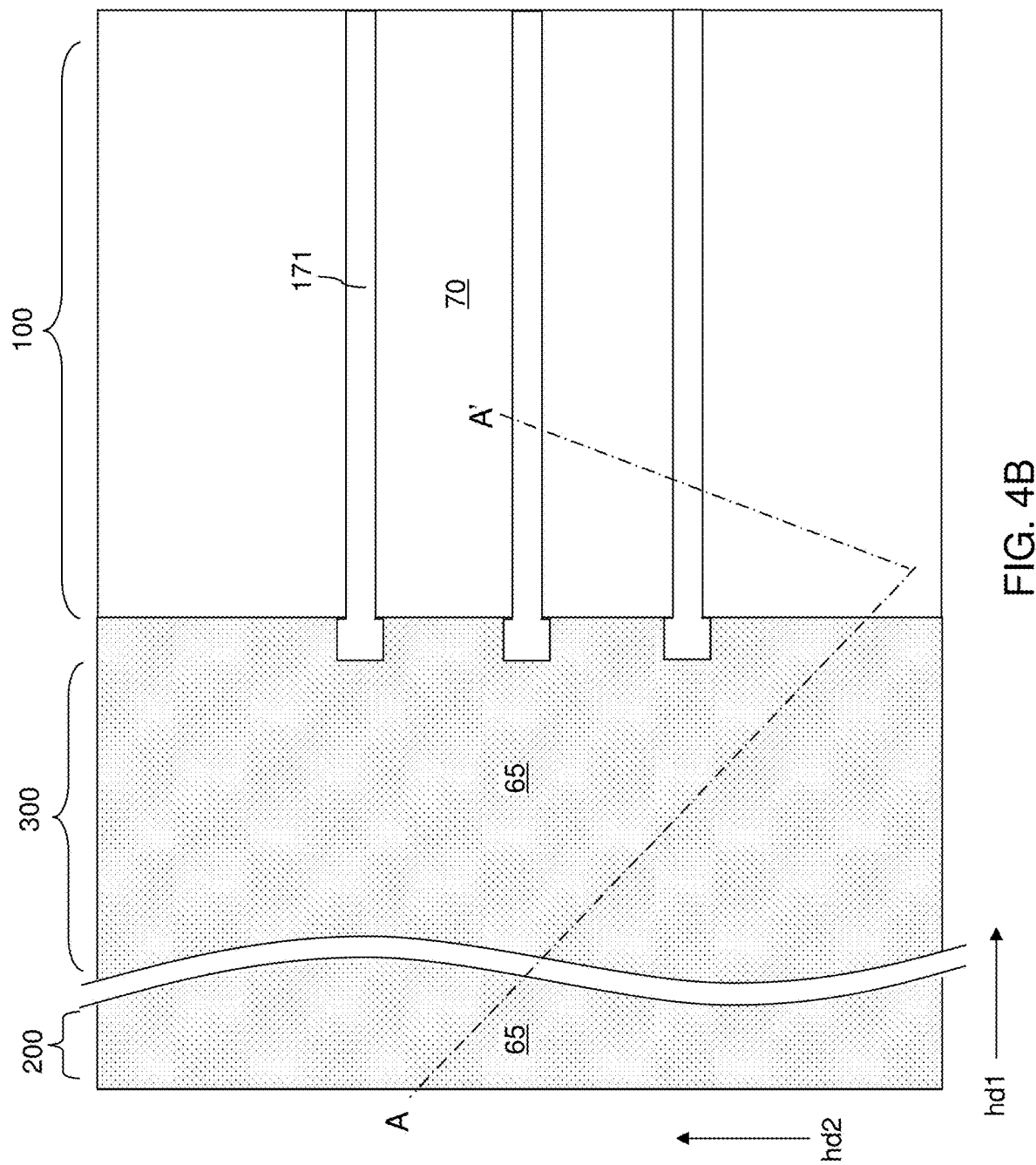
FIG. 4B is a top-down view of the exemplary structure along the vertical plane B-B' of FIG. 4A. The horizontal plane B-B' is the plane of the horizontal cross-sectional view of FIG. 4A.

Referring to FIGS. 4A and 4B, a photoresist layer can be applied over the insulating cap layer 70, and can be lithographically patterned to form slit-shaped openings that laterally extend along the first horizontal direction hd1 (e.g., word line direction) and are laterally spaced apart along the second horizontal direction hd2 (e.g., bit line direction). Each slit shaped opening in the photoresist layer can laterally extend along the first horizontal direction hd1 along the entire length of the memory array region 100, and can extend into each staircase region 300. Each slit-shaped opening can laterally extend over each vertical sidewall of the at least one drain-select-level sacrificial material layer 142L that contact the retro-stepped dielectric material portion 65. Each slit-shaped opening may have a uniform width over the memory array region 100 and may have a laterally bulging portion within areas that overlap with the area of the retro-stepped dielectric material portion 65.

An anisotropic etch process can be performed to transfer the pattern of the slit-shaped openings in the photoresist layer through the insulating cap layer 70, each drain-select-level sacrificial material layer 142L, and each drain-select-level insulating layer 132L. Drain-select-level slit trenches 171 are formed through the insulating cap layer 70, each drain-select-level sacrificial material layer 142L, and each drain-select-level insulating layer 132L underneath the openings in the photoresist layer. A bottom surface of each drain-select-level slit trench 171 can be formed in the topmost layer word-line-isolation insulating layer 32. Each drain-select-level slit trench 171 extends along the entire length of the memory array region 100 in which all layers of the word-line-level alternating stack (32, 42) and the drain-select-level alternating stack (132L, 142L) are present, and may extend into the retro-stepped dielectric material portion 65 and may cuts through each vertical sidewall of the at least one drain-select-level sacrificial material layer 142L that contacts the retro-stepped dielectric material portion 65. Each drain-select-level slit trench 171 may have a bulging region within the staircase region 300. The width of each portion of the drain-select-level slit trench 171 in the memory array region 100 may be in a range from 15 nm to 100 nm, such as from 20 nm to 50 nm, although lesser and greater widths can also be employed. The width of each drain-select-level slit trench 171 is less than an inter-row pitch of rows along the second horizontal direction hd2 of memory openings to be subsequently formed. The photoresist layer can be subsequently removed, for example, by ashing.

Figure 5A:
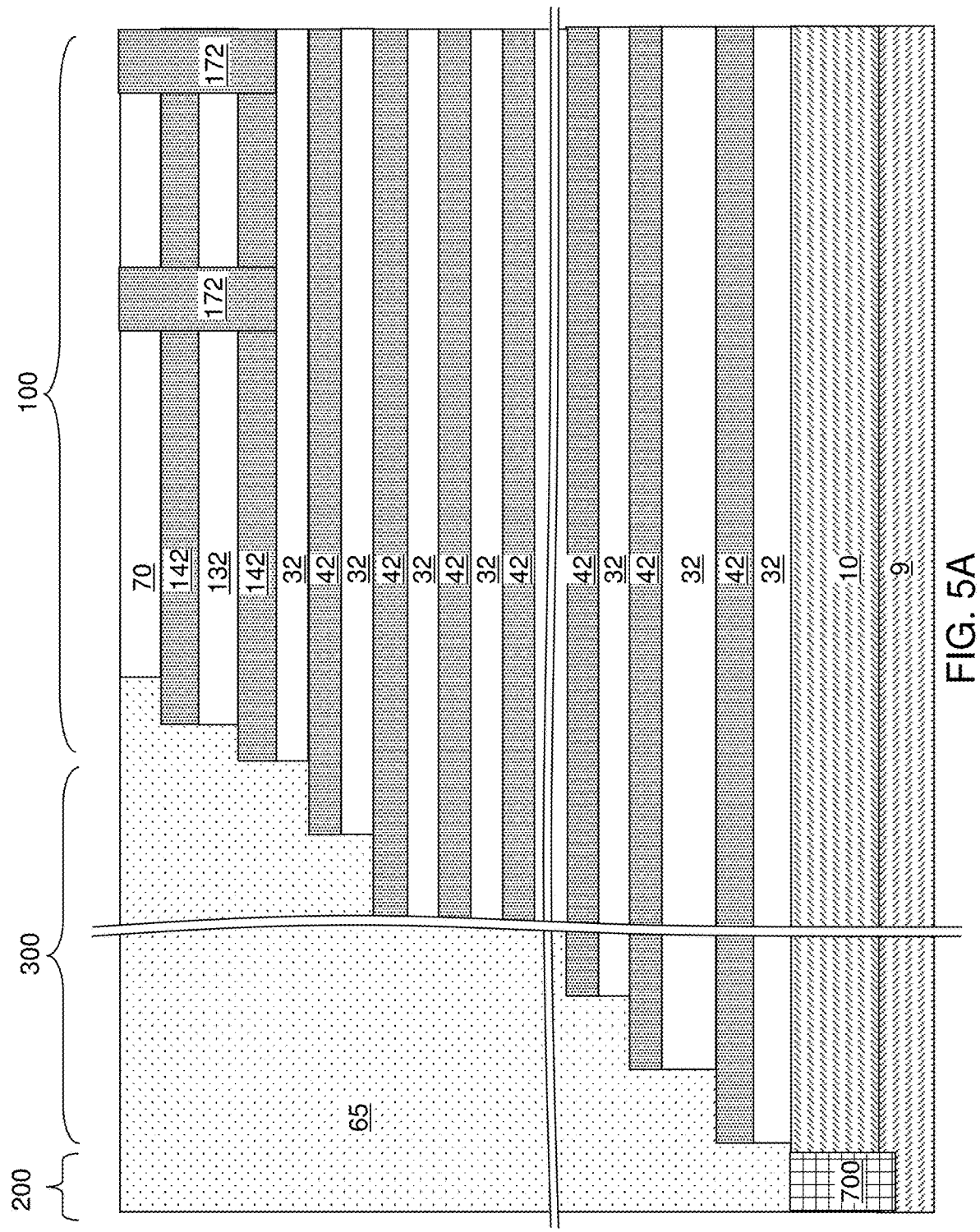
FIG. 5A is a horizontal cross-sectional view of the exemplary structure after formation of sacrificial drain-select-level strips according to an embodiment of the present disclosure.
Figure 5B:
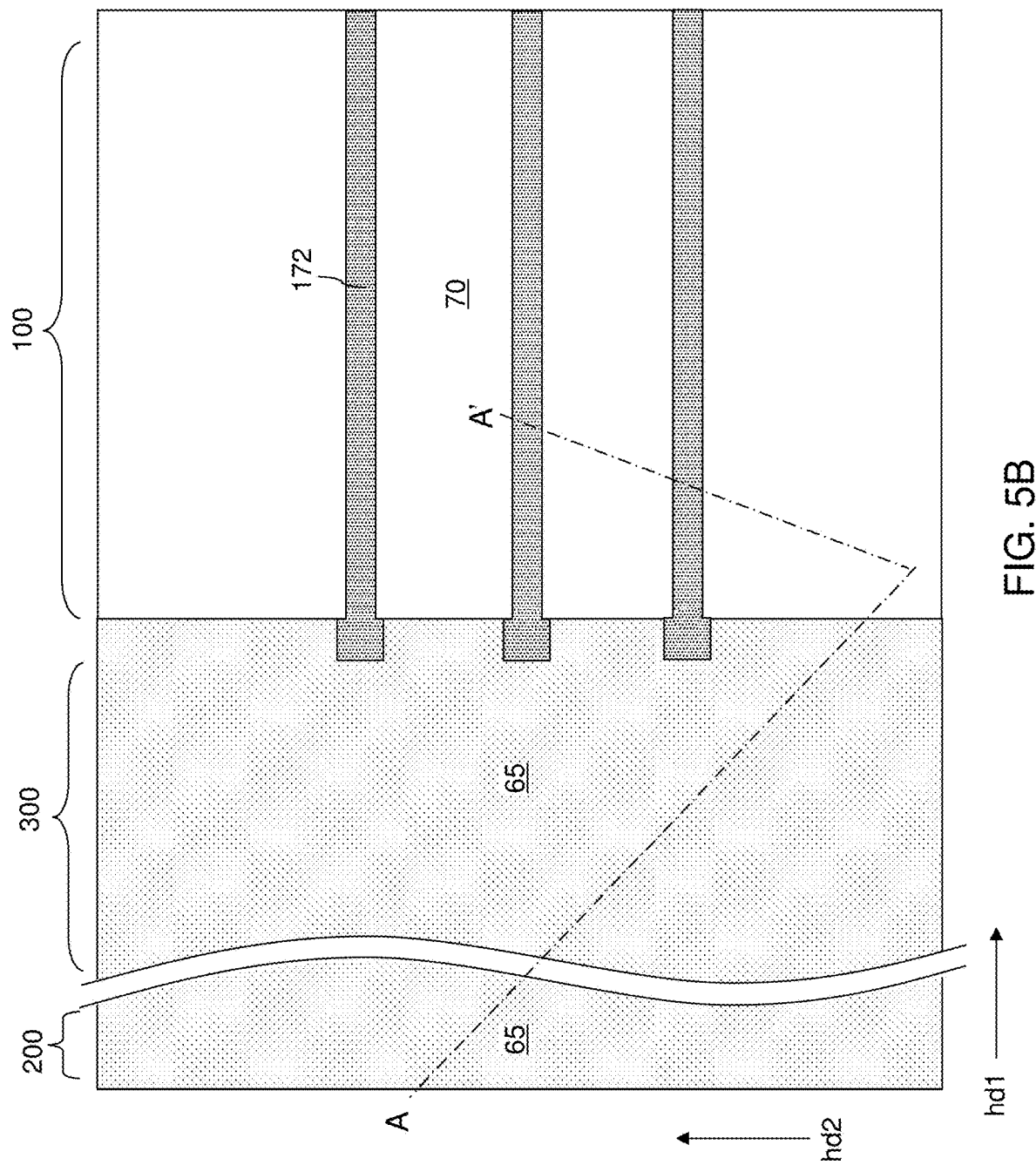
FIG. 5B is a top-down view of the exemplary structure along the vertical plane B-B' of FIG. 5A. The horizontal plane B-B' is the plane of the horizontal cross-sectional view of FIG. 5A.

Referring to FIGS. 5A and 5B, the drain-select-level slit trenches 171 can be filled with a sacrificial material such as silicon nitride, amorphous silicon, polysilicon, a silicon-germanium alloy, a silicon-containing polymer, amorphous carbon, diamond-like carbon, or organosilicate glass. The sacrificial material that fills the drain-select-level slit trenches 171 may be the same as, or may be different from, the sacrificial material(s) of the word-line-level sacrificial material layers 42 and the drain-select-level sacrificial material layers 142L. In one embodiment, the sacrificial material that fills the drain-select-level slit trenches 171 can be the same as the sacrificial material of the word-line-level sacrificial material layers 42 and the drain-select-level sacrificial material layers 142L. For example, the sacrificial material that fills the drain-select-level slit trenches 171 and the sacrificial material of the word-line-level sacrificial material layers 42 and the drain-select-level sacrificial material layers 142L can be silicon nitride. In another embodiment, the sacrificial material that fills the drain-select-level slit trenches 171 can be different from the sacrificial material(s) of the word-line-level sacrificial material layers 42 and the drain-select-level sacrificial material layers 142L.

Excess portions of the sacrificial material can be removed from above the insulating cap layer 70 by a planarization process. The planarization process can employ a recess etch and/or chemical mechanical planarization (CMP). Each remaining portion of the sacrificial material that fills a respective one of the drain-select-level slit trenches 171 constitutes a sacrificial drain-select-level strip 172. The width of each sacrificial drain-select-level strip 172 is less than an inter-row pitch along the second horizontal direction hd2 of rows of memory openings to be subsequently formed.

The sacrificial drain-select-level strips 172 laterally extend along the first horizontal direction hd1 through each of the at least one drain-select-level sacrificial material layer 142L. Each of at least one drain-select-level sacrificial material layer 142L as provided at the processing steps of FIGS. 4A and 4B is divided into memory strings having a respective set of drain-select-level sacrificial material plates 142. Each of at least one drain-select-level insulating layer 132L as provided at the processing steps of FIGS. 4A and 4B is divided into a respective set of drain-select-level insulating plates 132. Each drain-select-level sacrificial material plate 142 can have a respective uniform width along the second horizontal direction hd2. Each sacrificial drain-select-level plate 142 can have a uniform width in the memory array region 100, and the uniform width can be less than a center-to-center distance along the second horizontal direction hd2 between a neighboring pair of rows of memory opening to be subsequently formed. A drain-select-level alternating stack (132, 142) can include multiple drain-select-level sacrificial material plates 142 and multiple drain-select-level insulating plates 132 that are located at different levels.

Figure 6A:
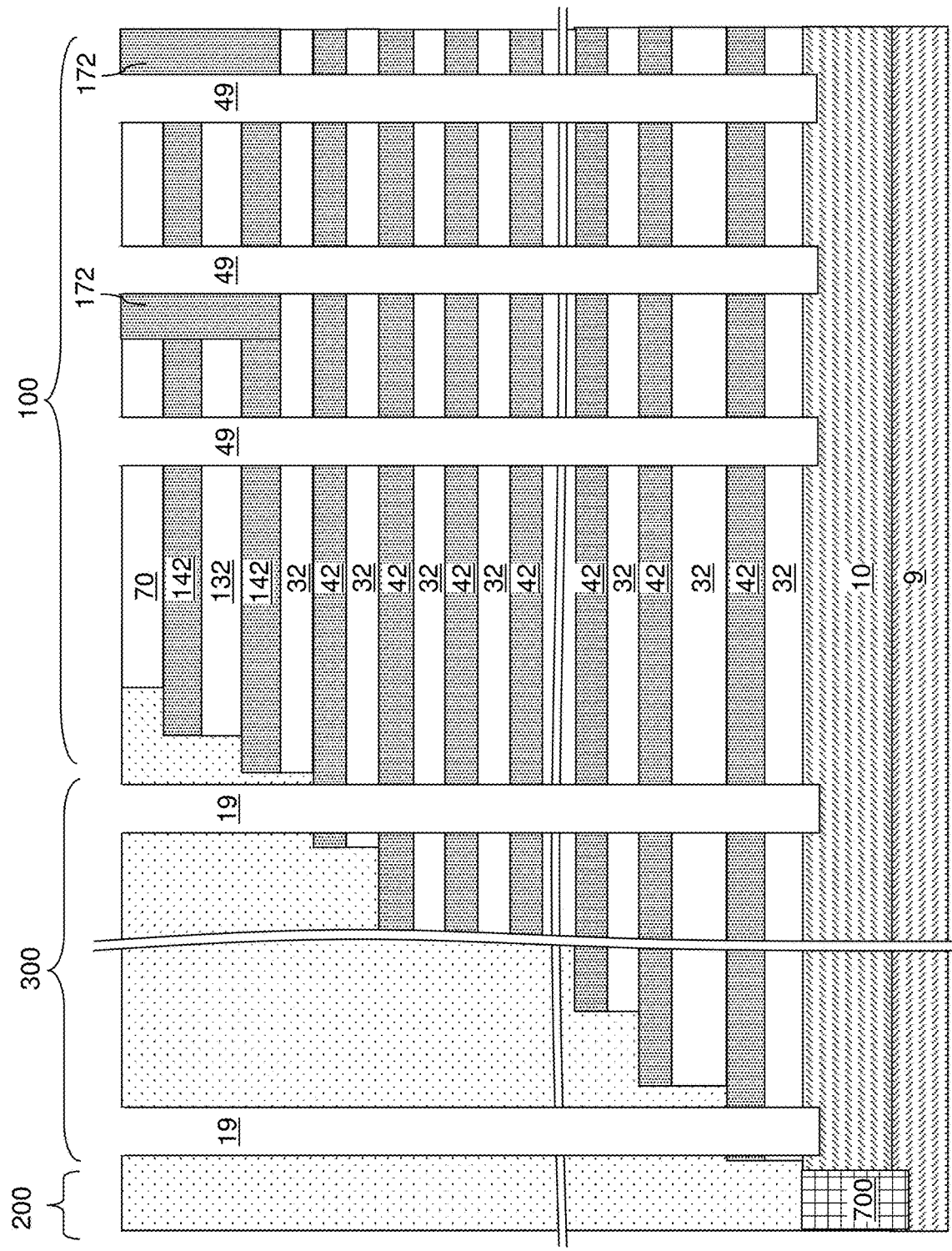
FIG. 6A is a horizontal cross-sectional view of the exemplary structure after formation of memory openings according to an embodiment of the present disclosure.
Figure 6B:
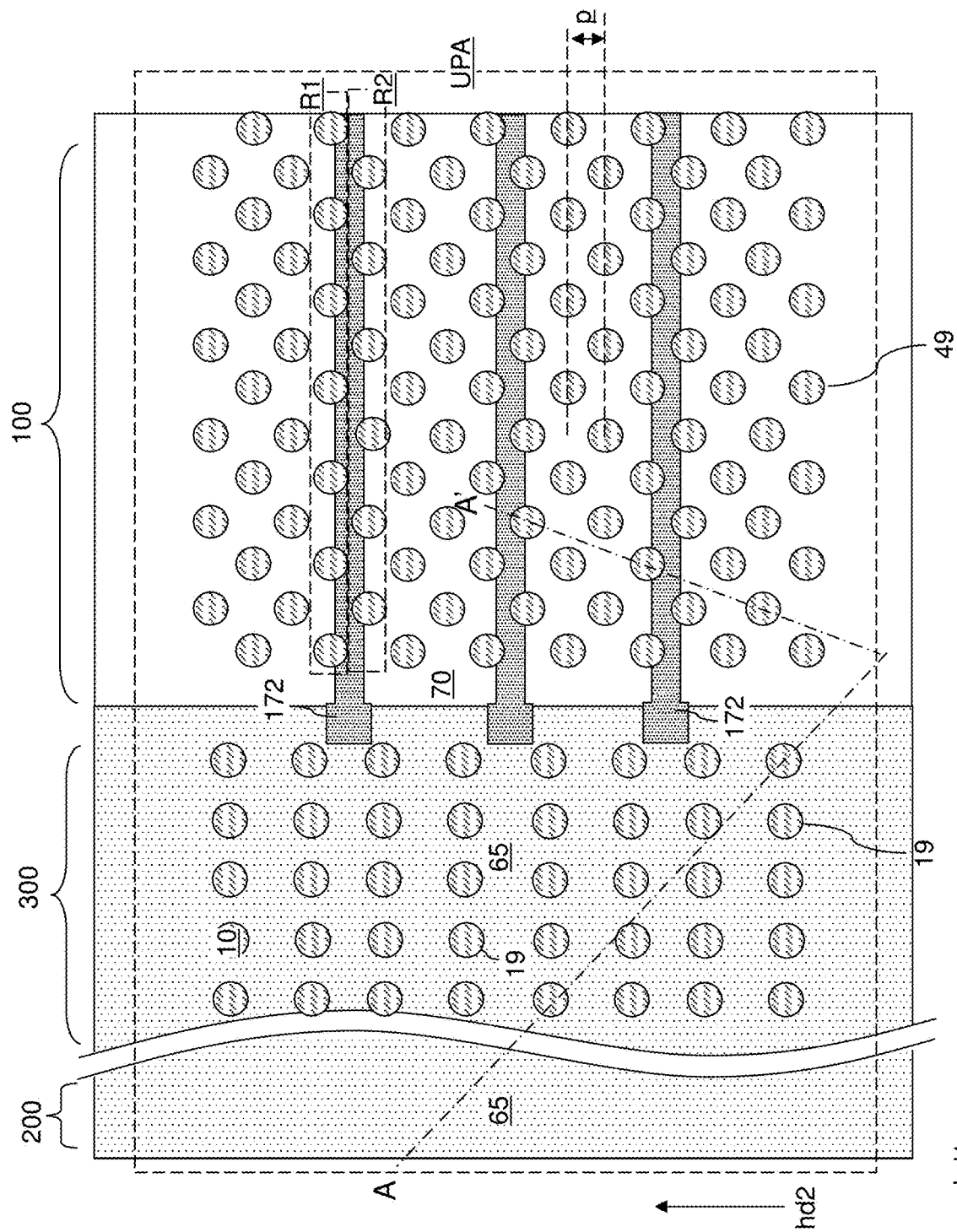
FIG. 6B is a top-down view of the exemplary structure along the vertical plane B-B' of FIG. 6A. The horizontal plane B-B' is the plane of the horizontal cross-sectional view of FIG. 6A.

Referring to FIGS. 6A and 6B, a photoresist layer (not shown) can be applied over the insulating cap layer 70. The photoresist layer can be lithographically patterned to form arrays of first openings in the memory array region 100 and to form arrays of second openings in the staircase region 300. The exemplary structure can include multiple unit pattern areas UPA (e.g., memory blocks) that are repeated along the second horizontal direction hd2, as shown in FIG. 6B. Each unit pattern area UPA includes a same pattern. In one embodiment, each unit pattern area UPA can include a two-dimensional array of first openings in the photoresist layer and a two-dimensional array of second openings in the photoresist layer. In one embodiment, each array of first openings in the photoresist layer may be formed as multiple rows of opening such that each row of first openings is arranged along the first horizontal direction hd1, and neighboring rows of first openings are laterally spaced apart along the second horizontal direction hd2. Multiple arrays of first openings that are laterally spaced apart along the second horizontal direction hd2 may be formed in the memory array region 100. Each array of first openings in the memory array region 100 may be formed as a two-dimensional periodic array including multiple rows of first openings.

An anisotropic etch process can be performed to transfer the pattern of the openings in the photoresist layer through the insulating cap layer 70 (which is in the form of multiple discrete portions), the drain-select-level alternating stack (132, 142), the word-line-level alternating stack (32, 42), and the retro-stepped dielectric material portion 65. Memory openings 49 are formed underneath the arrays of first openings in the photoresist layer, and support openings 19 are formed underneath the arrays of second openings in the photoresist layer. The photoresist layer can be subsequently removed, for example, by ashing.

The memory openings 49 are formed in the memory array region 100, and the support openings 19 are formed in the staircase region 300. Each unit pattern area UPA can include an array of memory openings 49 in the memory array region 100, and an array of support openings 19 in the staircase region 300. The array of memory openings 49 within each unit pattern area UPA can be a periodic two-dimensional array of memory openings 49 including multiple rows of memory openings 49. Each row of memory openings 49 includes multiple memory openings 49 that are arranged along the first horizontal direction hd1. Each neighboring pair of rows of memory openings 49 within the two-dimensional array of memory openings 49 can be laterally spaced apart along the second horizontal direction hd2 with a same center-to-center distance.

Generally, multiple parallel rows of memory openings 49 are formed through the drain-select-level alternating stack (132, 142), the word-line-level alternating stack (32 42), and the sacrificial drain-select-level strips 172. Memory openings 49 within each row are arranged along the first horizontal direction hd1, which is parallel to the lengthwise direction of the sacrificial drain-select-level strips 172. The multiple parallel rows are laterally spaced apart along the second horizontal direction hd2. Lengthwise sidewalls of each sacrificial drain-select-level strip 172 can be perforated with a respective pair of rows (R1, R2) of memory openings 49, as shown in FIG. 6B. Segments of each sacrificial drain-select-level strip 172 are etched during formation of the memory openings 49. The sacrificial drain-select-level strips 172 can be patterned such that each lengthwise sidewall of the sacrificial drain-select-level strips 172 include a laterally alternating sequence of concave vertical sidewall segments and planar vertical sidewall segments. As used herein, a "planar vertical sidewall segment" refers to a segment of a vertical sidewall that has a horizontal cross-sectional shape having a zero curvature. As used herein, a "concave vertical sidewall segment" refers to a segment of a vertical sidewall that has a horizontal cross-sections shape having a concave shape. The memory openings can extend to a top surface of the semiconductor material layer 10.

Each of the memory openings 49 can have a horizontal cross-sectional shape of a closed two-dimensional shape, such as a circle, an ellipse, a polygon (such as a rectangle), or any two-dimensional closed curvilinear shape. The lateral dimension (such as a diameter) of each memory openings 49 can be in a range from 30 nm to 300 nm, although lesser and greater lateral dimensions can also be employed. The support openings 19 can have lateral dimensions that may be the same as, greater than, or less than, the lateral dimensions of the memory openings 19.

Within each unit pattern area UPA, a first subset of the memory openings 49 can be formed through sidewalls of the sacrificial drain-select-level strips 172, and a second subset of the memory openings 49 can be laterally spaced from, and do not contact, any of the sacrificial drain-select-level strips 172. Within each unit pattern area UPA, the entire set of the memory openings 49 can be formed as a two-dimensional periodic array of memory openings 49 including multiple rows of memory openings 49 that laterally extend along the first horizontal direction hd1. The center-to-center inter-row pitch p of the rows of memory openings 49 in each unit pattern area UPA can be uniform, as shown in FIG. 6B. In other words, the pitch p between vertical planes that pass through the geometrical centers of memory openings 49 within a respective row of memory openings 49 can be the same within each unit pattern area UPA. The pattern of the memory openings 49 and the support openings 19 in the unit pattern area UPA can be repeated along the second horizontal direction with a same periodicity. The periodicity of the unit pattern areas UPA along the second horizontal direction hd2 can be the same as the width of the unit pattern area UPA along the second horizontal direction hd2.

In the illustrated example of FIGS. 6A and 6B, each unit pattern area UPA includes 16 rows of memory openings 49 that are arranged on-pitch, i.e., with a uniform center-to-center inter-row pitch p along the second horizontal direction hd2. Each unit pattern area UPA includes, from one side to another along the second horizontal direction hd2, three rows of memory openings 49 that belong to the second subset (i.e., the subset of memory openings 49 that do not intersect the sacrificial drain-select-level strips 172), two rows of memory openings 49 that belong to the first subset (i.e., the subset of memory openings 49 that intersect the sacrificial drain-select-level strips 172), three rows of memory openings 49 that belong to the second subset, two rows of memory openings 49 that belong to the first subset, three rows of memory openings 49 that belong to the second subset, two rows of memory openings 49 that belong to the first subset, and three rows of memory openings 49 that belong to the second subset.

FIGS. 7A-7H are sequential vertical cross-sectional views of a memory opening during formation of a memory opening fill structure according to an embodiment of the present disclosure. The same structural change occurs simultaneously in each of the other memory openings 49 and in each of the support openings 19.

Referring to FIG. 7A, a memory opening 49 in the exemplary device structure of FIGS. 6A and 6B is illustrated. The memory opening 49 extends through the insulating cap layer 70, the drain-select-level alternating stack (132, 142), the word-line-level alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the word-line-level sacrificial material layers 42 can be laterally recessed partially to form lateral recesses (not shown), for example, by an isotropic etch.

Referring to FIG. 7B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost word-line-level sacrificial material layer 42. In this case, a source select gate electrode can be subsequently formed by replacing the bottommost word-line-level sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 7C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the word-line-level sacrificial material layers 42 and the word-line-isolation insulating layers 32 can have vertically coincident sidewalls, and the charge storage layer 54 can be formed as a single continuous layer.

In another embodiment, the word-line-level sacrificial material layers 42 can be laterally recessed with respect to the sidewalls of the word-line-isolation insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 7D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the word-line-level sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figures 7E, 7F:
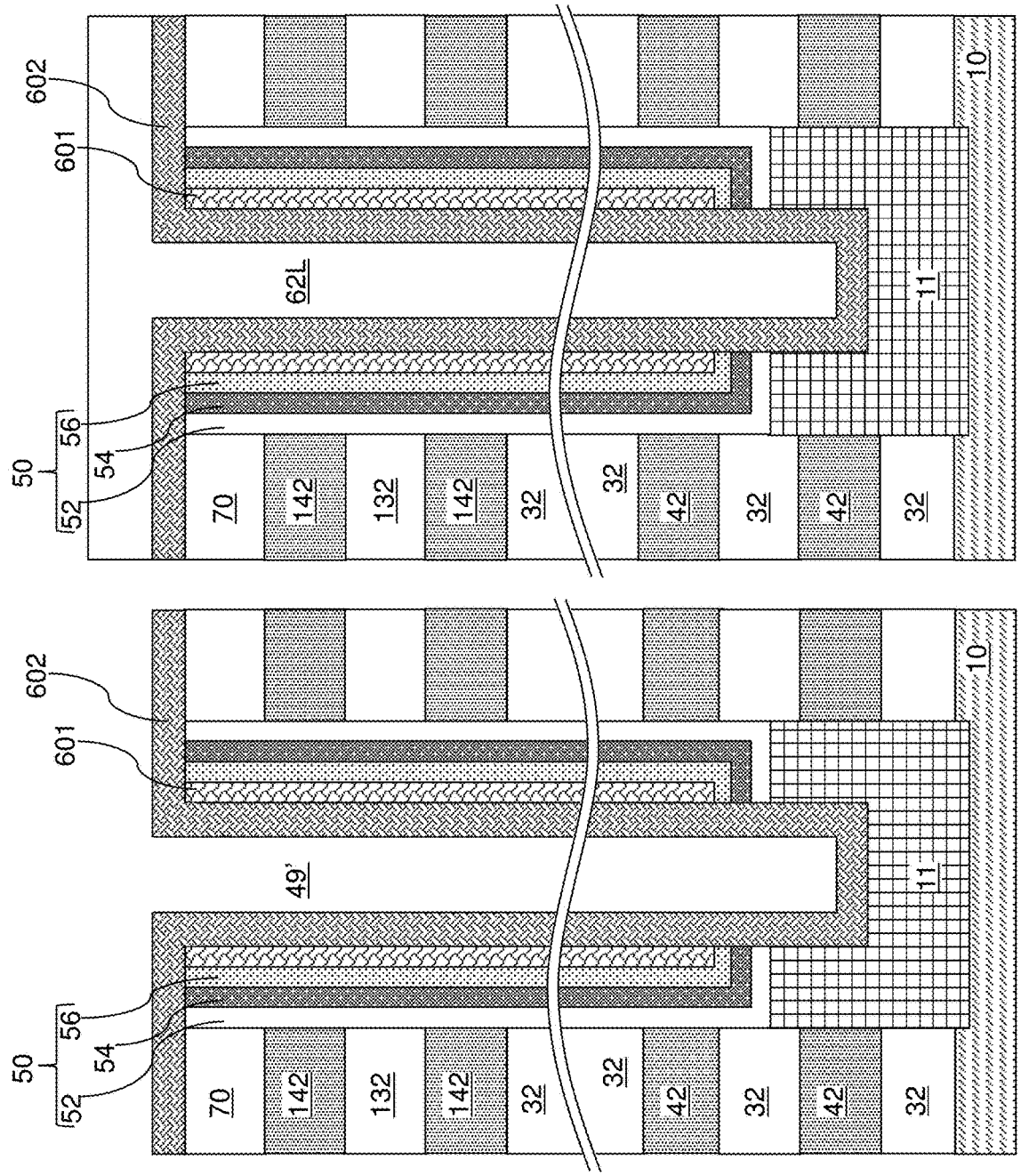

Referring to FIG. 7E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 7F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 7G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 7H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. In alternative embodiments, a blocking dielectric layer 52 may not be formed in each memory opening 49, and may be subsequently formed in backside recesses that are formed by removal of the word-line-level sacrificial material layers 42 at a subsequent processing step.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 8A:
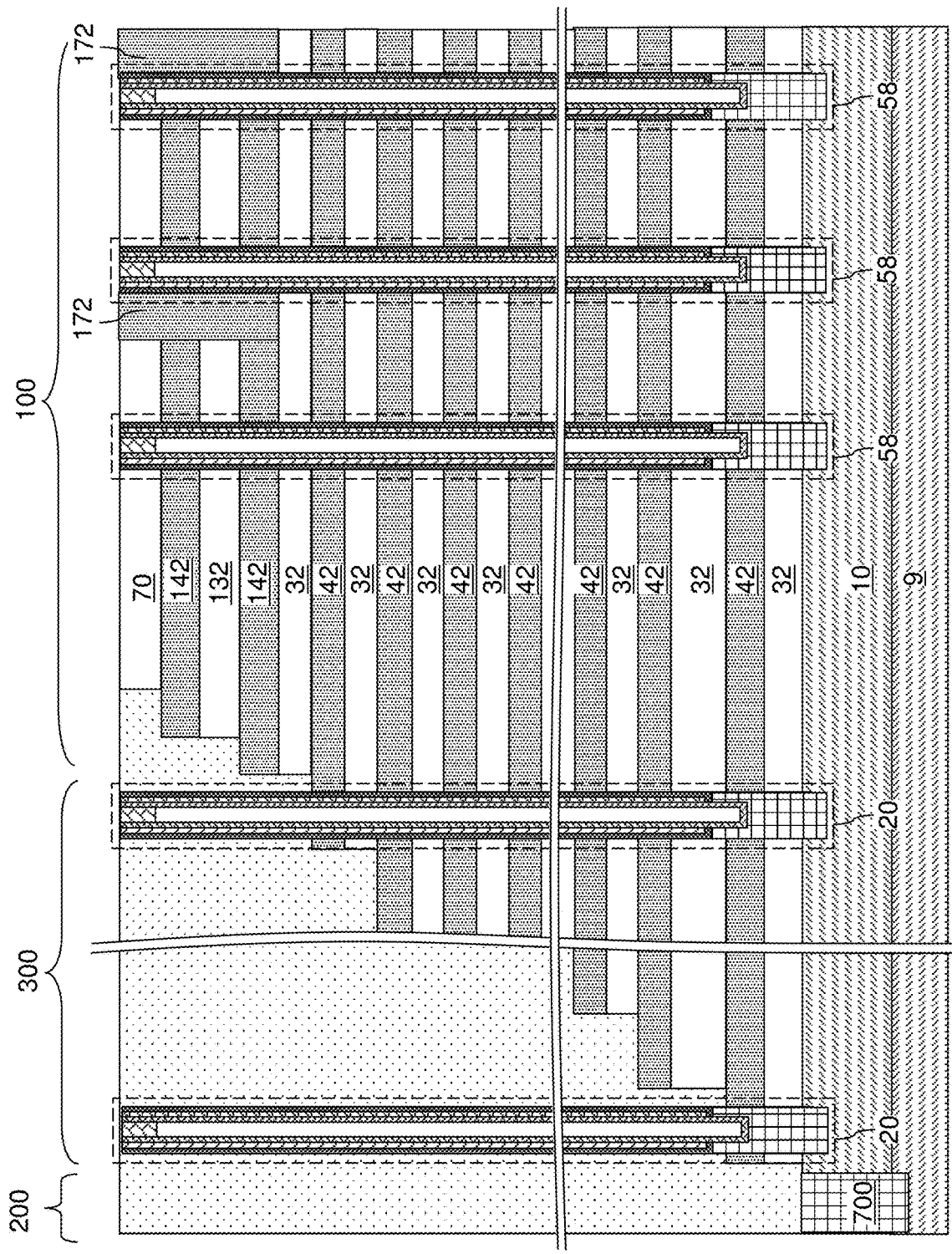
FIG. 8A is a horizontal cross-sectional view of the exemplary structure after formation of memory stack structures according to an embodiment of the present disclosure.
Figure 8B:
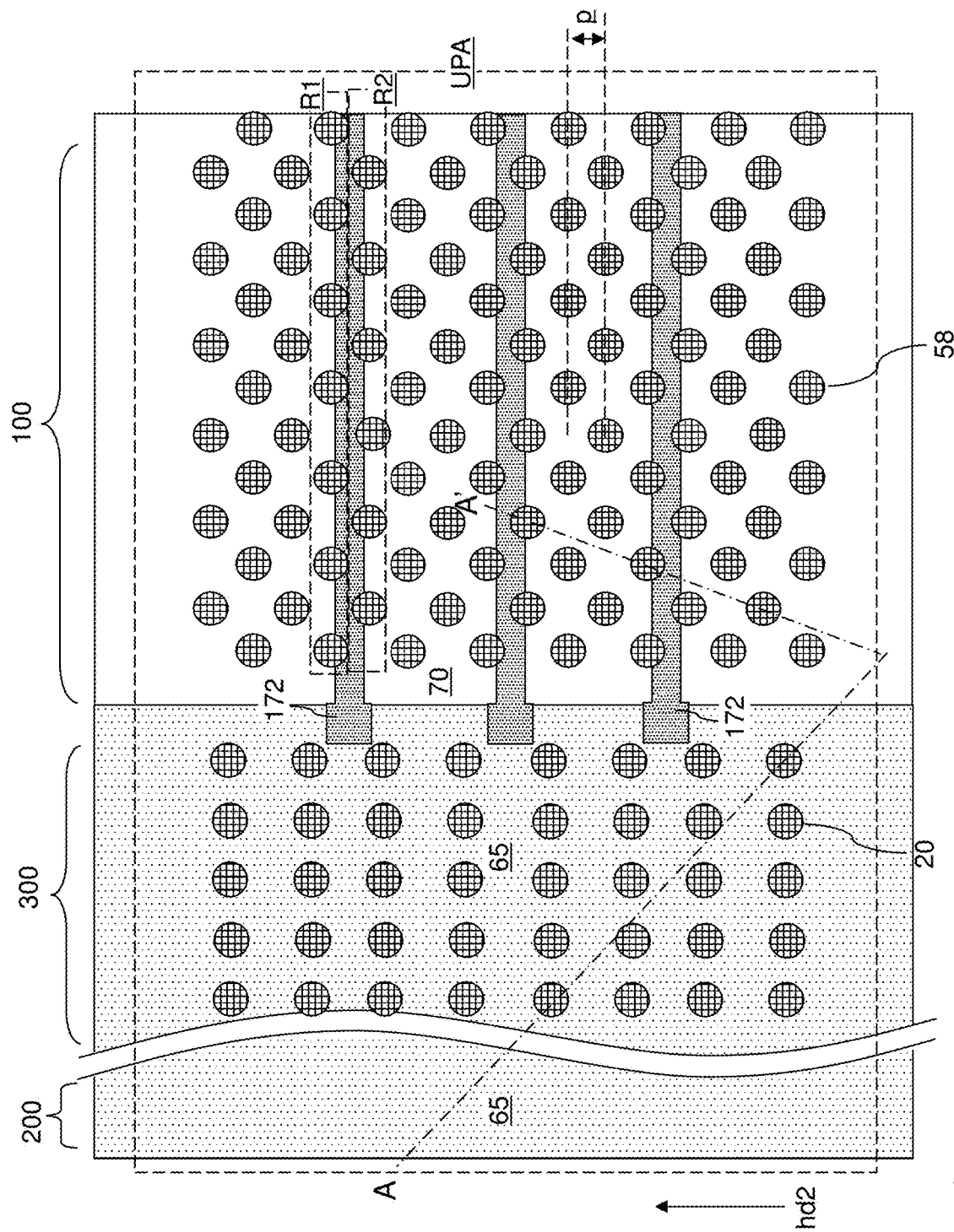
FIG. 8B is a top-down view of the exemplary structure along the vertical plane B-B' of FIG. 8A. The horizontal plane B-B' is the plane of the horizontal cross-sectional view of FIG. 8A.

Referring to FIGS. 8A and 8B, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 6A and 6B. An instance of the support pillar structure 20 can be formed within each support opening 19 of the structure of FIGS. 6A and 6B.

Each memory stack structure 55 includes a memory film 50 and a vertical semiconductor channel 60, which may comprise multiple semiconductor channel layers (601, 602). The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. The memory stack structures 55 are arranged as multiple rows of memory stack structures 55. Each row of memory stack structures 55 laterally extends along the first horizontal direction hd1, and the multiple rows of memory stack structures 55 are laterally spaced apart long the second horizontal direction hd2.

While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 9A:
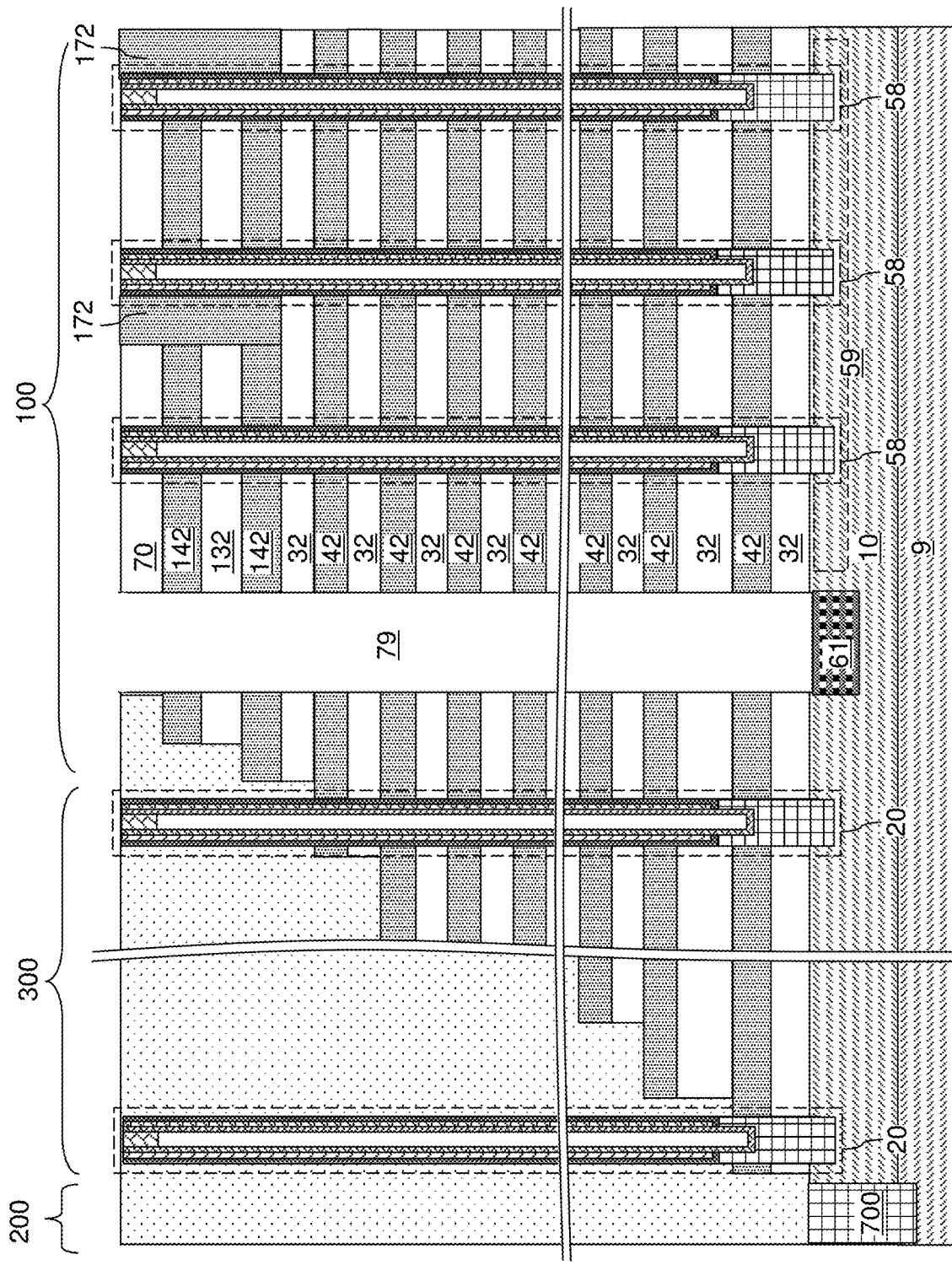
FIG. 9A is a horizontal cross-sectional view of the exemplary structure after formation of backside trenches according to an embodiment of the present disclosure.
Figure 9B:
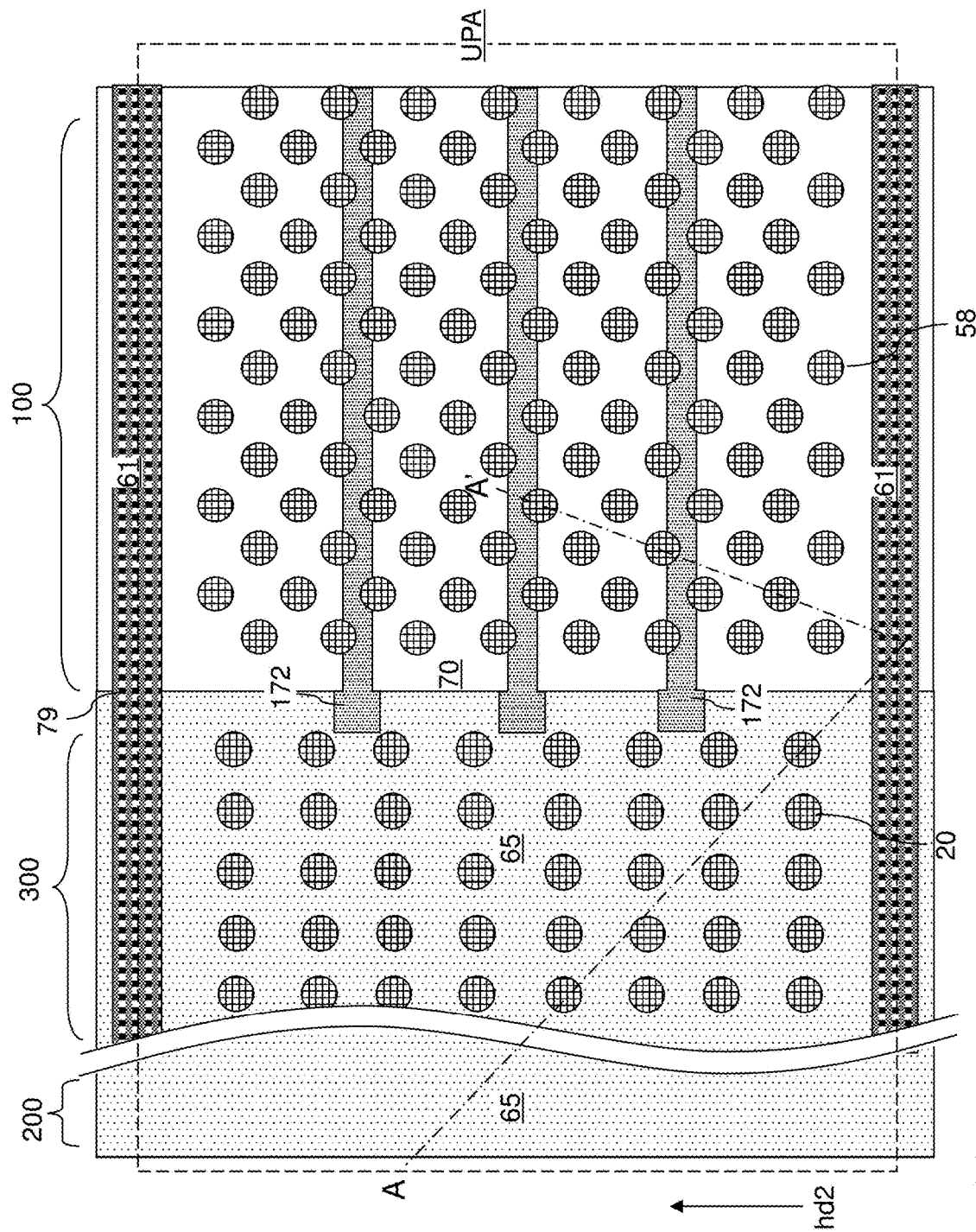
FIG. 9B is a top-down view of the exemplary structure along the vertical plane B-B' of FIG. 9A. The horizontal plane B-B' is the plane of the horizontal cross-sectional view of FIG. 9A.

Referring to FIGS. 9A and 9B, a photoresist layer (not shown) can be applied over the insulating cap layer 70, and is lithographically patterned to form openings in areas of boundaries between the unit pattern areas UPA that laterally extend along the first horizontal direction hd1. Each opening in the photoresist layer may have a uniform width along the second horizontal direction, and the overlap with of each opening in the photoresist layer with each unit pattern area UPA can be about one half of the width of the opening in the photoresist layer. The pattern in the photoresist layer can be transferred through the insulating cap layer 70, the drain-select-level alternating stack (132, 142), the word-line-level alternating stack (32, 42) and/or the retro-stepped dielectric material portion 65 employing an anisotropic etch. Backside trenches 79 are formed, which vertically extend from the top surface of the insulating cap layer 70 at least to the top surface of the substrate (9, 10), and laterally extend through the memory array region 100 and the staircase region 300.

Each backside trench 79 can have a uniform width along the second horizontal direction hd2. The center-to-center pitch of the backside trenches 79 along the second horizontal direction hd2 can be the same as the width of the unit pattern area UPA along the second horizontal direction hd2. The memory stack structures 55 can be arranged in rows that extend along the first horizontal direction hd1. The sacrificial drain-select-level strips 172 can laterally extend along the first horizontal direction hd1. Each backside trench 79 can have a uniform width that is invariant along the lengthwise direction (i.e., along the first horizontal direction hd1). Lengthwise sidewalls of the sacrificial drain-select-level strips 172 that generally extend along the first horizontal direction hd1 can have a lateral undulation along the second horizontal direction hd2. Multiple rows of memory stack structures 55 can be located between a neighboring pair of a backside trench 79 and a sacrificial drain-select-level strip 172, or between a neighboring pair of sacrificial drain-select-level strips 172. The photoresist layer can be removed, for example, by ashing.

Optionally, dopants of the second conductivity type can be implanted into portions of the semiconductor material layer 10 that underlie the backside trenches 79 to form source regions 61. The atomic concentration of the dopants of the second conductivity type in the source regions 61 can be in a range from $5.0 \times 10^{18}/cm^3$ to $2.0 \times 10^{21}/cm^3$, although lesser and greater atomic concentrations can also be employed. Surface portions of the semiconductor material layer 10 that extend between each source region 61 and adjacent memory opening fill structures 58 comprise horizontal semiconductor channels 59. Alternatively, if the driver circuit semiconductor devices 700 are located under the alternating stacks in the memory array region 100 in a CMOS under array configuration, then the source region 61 and the horizontal channels 59 may be omitted. Instead, a horizontal source line (e.g., direct strap contact) may be provided in contact with a sidewall of a lower part of the semiconductor channels 60.

Figure 10:
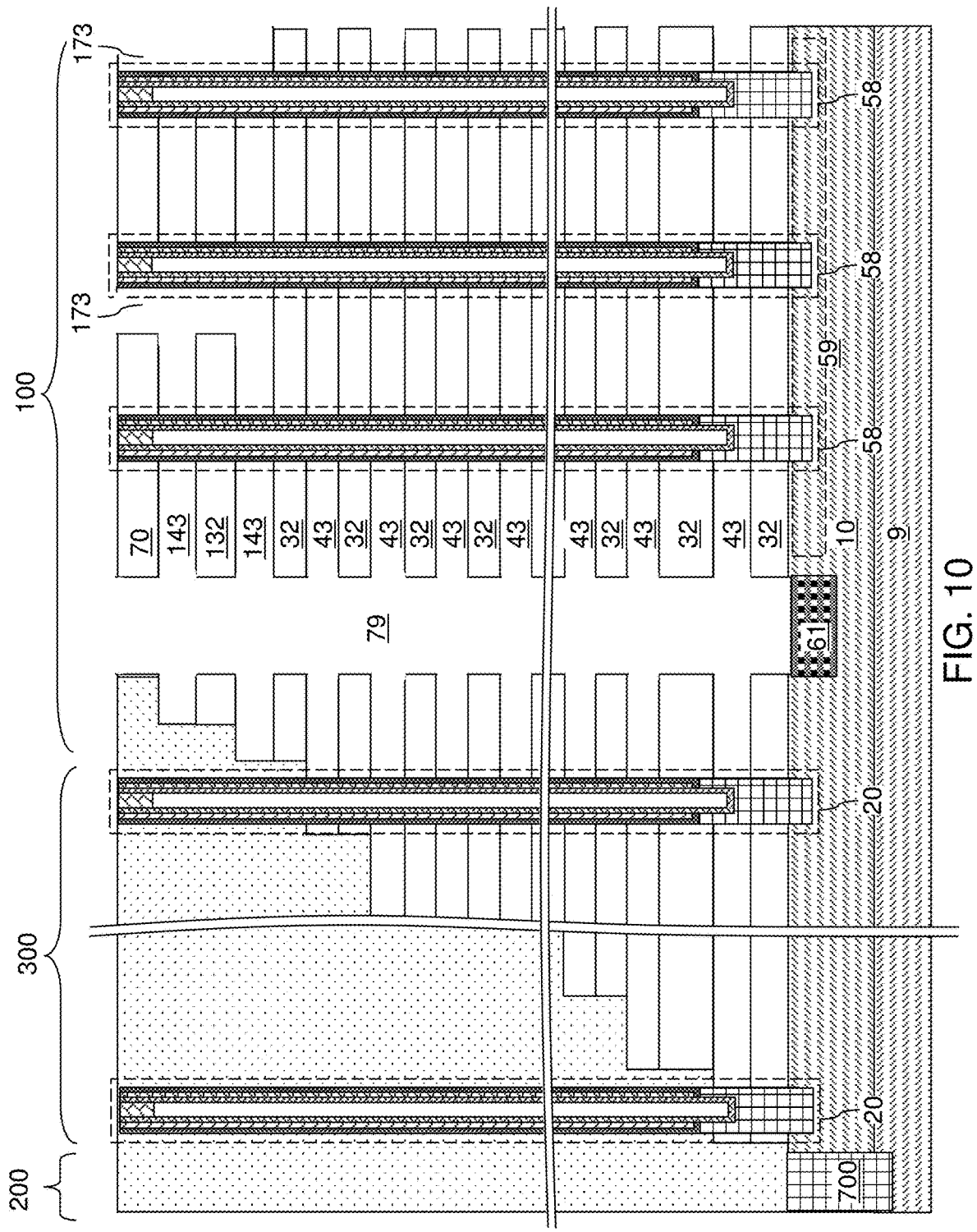
FIG. 10 is a horizontal cross-sectional view of the exemplary structure after formation of backside recesses according to an embodiment of the present disclosure.

Referring to FIGS. 10 and 11A, an etchant that selectively etches the materials of the word-line-level sacrificial material layers 42, the drain-select-level sacrificial material plates 142, and the sacrificial drain-select-level strips 172 with respect to the materials of the word-line-isolation insulating layers 32 and the drain-select-level insulating plates 132 can be introduced into the backside trenches 79, for example, employing an isotropic etch process. Word-line-level backside recesses 43 are formed in volumes from which the word-line-level sacrificial material layers 42 are removed. Drain-select-level backside recesses 143 are formed in volumes from which the drain-select-level sacrificial material plates 142 are removed. Drain-select-level slit trenches 173 are formed in volumes from which the sacrificial drain-select-level strips 172 are removed. Each drain-select-level slit trench 173 has a lesser volume than a corresponding drain-select-level slit trench 171 because upper portions of two rows of memory opening fill structures 58 protrude into peripheral portions of the drain-select-level slit trench 173.

The removal of the word-line-level sacrificial material layers 42, the drain-select-level sacrificial material plates 142, and the sacrificial drain-select-level strips 172 can be selective to the material of the word-line-isolation insulating layers 32, the material of the drain-select-level insulating plates 132, the material of the retro-stepped dielectric material portion 65, the semiconductor material of the semiconductor material layer 10, and the material of the outermost layer of the memory films 50. In one embodiment, the word-line-level sacrificial material layers 42, the drain-select-level sacrificial material plates 142, and the sacrificial drain-select-level strips 172 can include silicon nitride, and the materials of the word-line-isolation insulating layers 32, the drain-select-level insulating plates 132, and the retro-stepped dielectric material portion 65 can be selected from silicon oxide and dielectric metal oxides.

The etch process that forms the can be a wet etch process employing a wet etch solution, or can be a gas phase (dry) etch process in which the etchant is introduced in a vapor phase into the backside trenches 79. For example, if the word-line-level sacrificial material layers 42, the drain-select-level sacrificial material plates 142, and the sacrificial drain-select-level strips 172 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses (43, 143) are present within volumes previously occupied by the sacrificial material layers (42, 142). The backside recesses (43, 143) collectively refer to the word-line-level backside recesses 43 and drain-select-level backside recesses 143. The sacrificial material layers (42, 142) collectively refer to the word-line-level sacrificial material layers 42 and the drain-select-level sacrificial material plates 142.

The memory openings in which the memory stack structures 55 are formed are herein referred to as front side openings or front side cavities in contrast with the backside recesses (43, 143). In one embodiment, the memory array region 100 comprises an array of monolithic three-dimensional NAND strings having a plurality of device levels disposed above the substrate (9, 10). In this case, each word-line-level backside recess 43 can define a space for receiving a respective word line of the array of monolithic three-dimensional NAND strings. Each drain-select-level backside recess 143 can define a space for receiving a respective drain-select-gate electrode to activating a respective group of vertical NAND strings. Each of the backside recesses (43, 143) can extend substantially parallel to the top surface of the substrate (9, 10). A word-line-level backside recess 43 can be vertically bounded by a top surface of an underlying word-line-isolation insulating layer 32 and a bottom surface of an overlying word-line-isolation insulating layer 32. In one embodiment, each backside recess 43 can have a uniform height throughout. A drain-select-level backside recess 143 can be vertically bounded by a top surface of an underlying word-line-isolation insulating layer 32 or an underlying drain-select-level insulating plate 132, and can be vertically bounded by a bottom surface of an overlying drain-select-level insulating plate 132 or an insulating cap layer 70. In one embodiment, each drain-select-level backside recess 143 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Dopants in the drain regions 63, the source regions 61, and the semiconductor channels 60 can be activated during the anneal process that forms the planar dielectric portions 616 and the tubular dielectric spacers 116. Alternatively, an additional anneal process may be performed to active the electrical dopants in the drain regions 63, the source regions 61, and the semiconductor channels 60.

Referring to FIG. 11B, a backside blocking dielectric layer 44 can be optionally formed. The backside blocking dielectric layer 44, if present, comprises a dielectric material that functions as a portion of a control gate dielectric for the control gates (i.e., word lines and drain-select-level electrodes) to be subsequently formed in the backside recesses (43, 143). In case the blocking dielectric layer 52 is present within each memory opening 49, the backside blocking dielectric layer 44 is optional. In case the blocking dielectric layer 52 is omitted, the backside blocking dielectric layer 44 is present.

The backside blocking dielectric layer 44 can be formed in the backside recesses (43, 143) and on the sidewalls of the backside trenches 79. The backside blocking dielectric layer 44 can be formed directly on horizontal surfaces of the insulating layers (32, 132) and sidewalls of the memory stack structures 55 within the backside recesses (43, 143). If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers (32,132), the portions of the sidewall surfaces of the memory stack structures 55 that are physically exposed to the backside recesses (43, 143), and a top surface of the planar dielectric portion 616. The insulating layers (32, 132) collectively refer to the word-line-isolation insulating layers 32 and the drain-select-level insulating plates 132. A backside cavity 79' is present within the portion of each backside trench 79 that is not filled with the backside blocking dielectric layer 44.

Referring to FIG. 11C, a metallic barrier layer 46A can be deposited in the backside recesses (43, 143). The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 12:
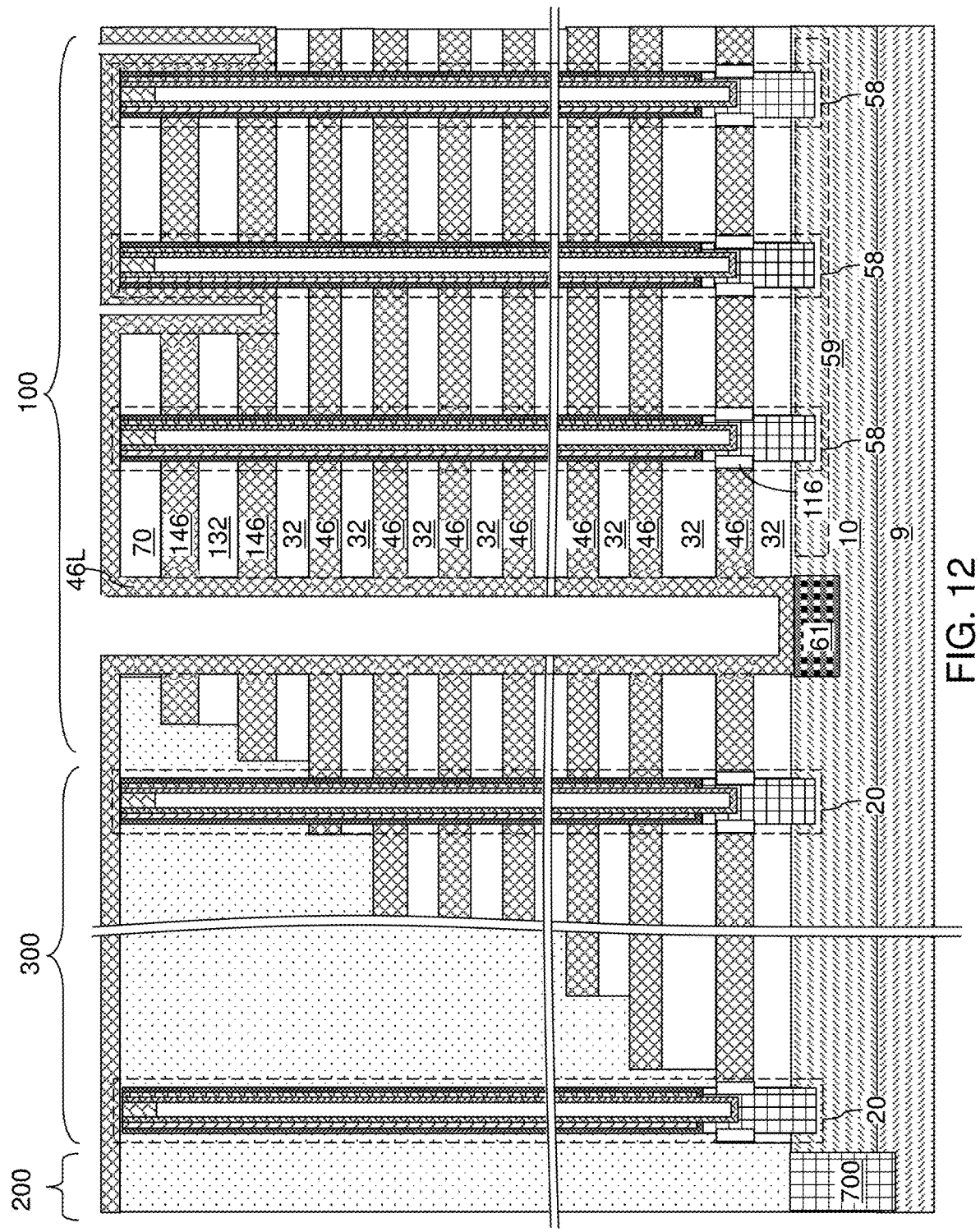
FIG. 12 is a horizontal cross-sectional view of the exemplary structure after formation of the electrically conductive layers and a continuous electrically conductive material layer according to an embodiment of the present disclosure.

Referring to FIGS. 11D and 12, a metal fill material is deposited in the plurality of backside recesses (43, 143), on the sidewalls of the backside trenches 79, and over the top surface of the insulating cap layer 70 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers (32, 132) and the memory stack structures 55 by the metallic barrier layer 46A, which can block diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 80. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 80.

Each word-line-level sacrificial material layer 42 can be replaced with a word-line-level electrically conductive layer 46. Each drain-select-level sacrificial material plate 142 can be replaced with a drain-select-level electrode 146, which is an electrically conductive layer formed at a drain select level. In one embodiment, a plurality of drain-select-level electrodes 146 located at multiple levels having different vertical separation distances from the substrate (9, 10) can be formed.

A backside cavity 79' is present in the portion of each backside trench 79 that is not filled with the backside blocking dielectric layer 44 and the continuous electrically conductive material layer 46L. The continuous electrically conducive material layer 46L can extend into each of the drain-select-level slit trenches 173. In one embodiment, a slit cavity (which is an unfilled volume of a drain-select-level slit trench 173) can be present within each drain-select-level slit trench 173. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 13A:
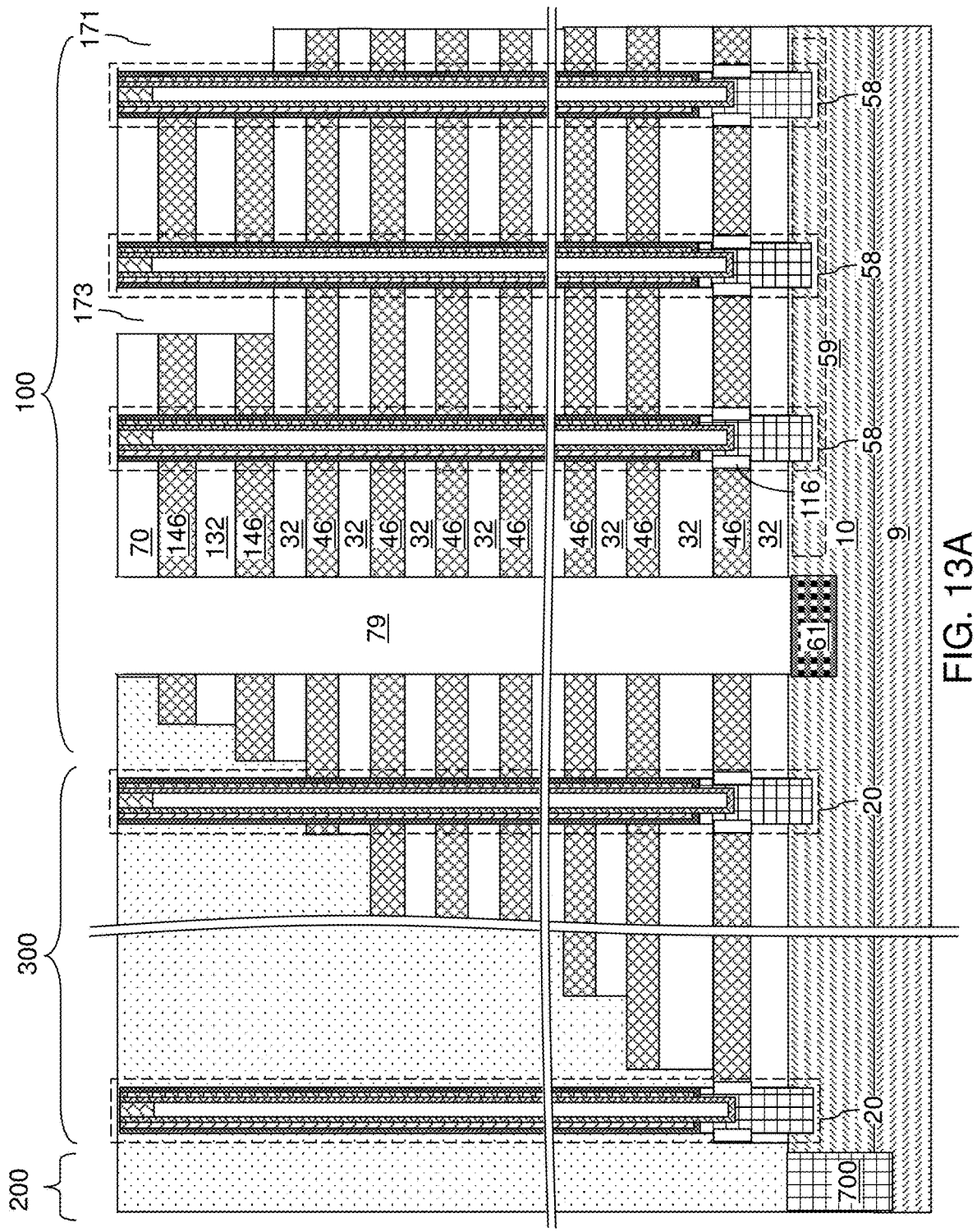
FIG. 13A is a horizontal cross-sectional view of the exemplary structure after removal of the continuous electrically conductive material layer according to an embodiment of the present disclosure.
Figure 13B:
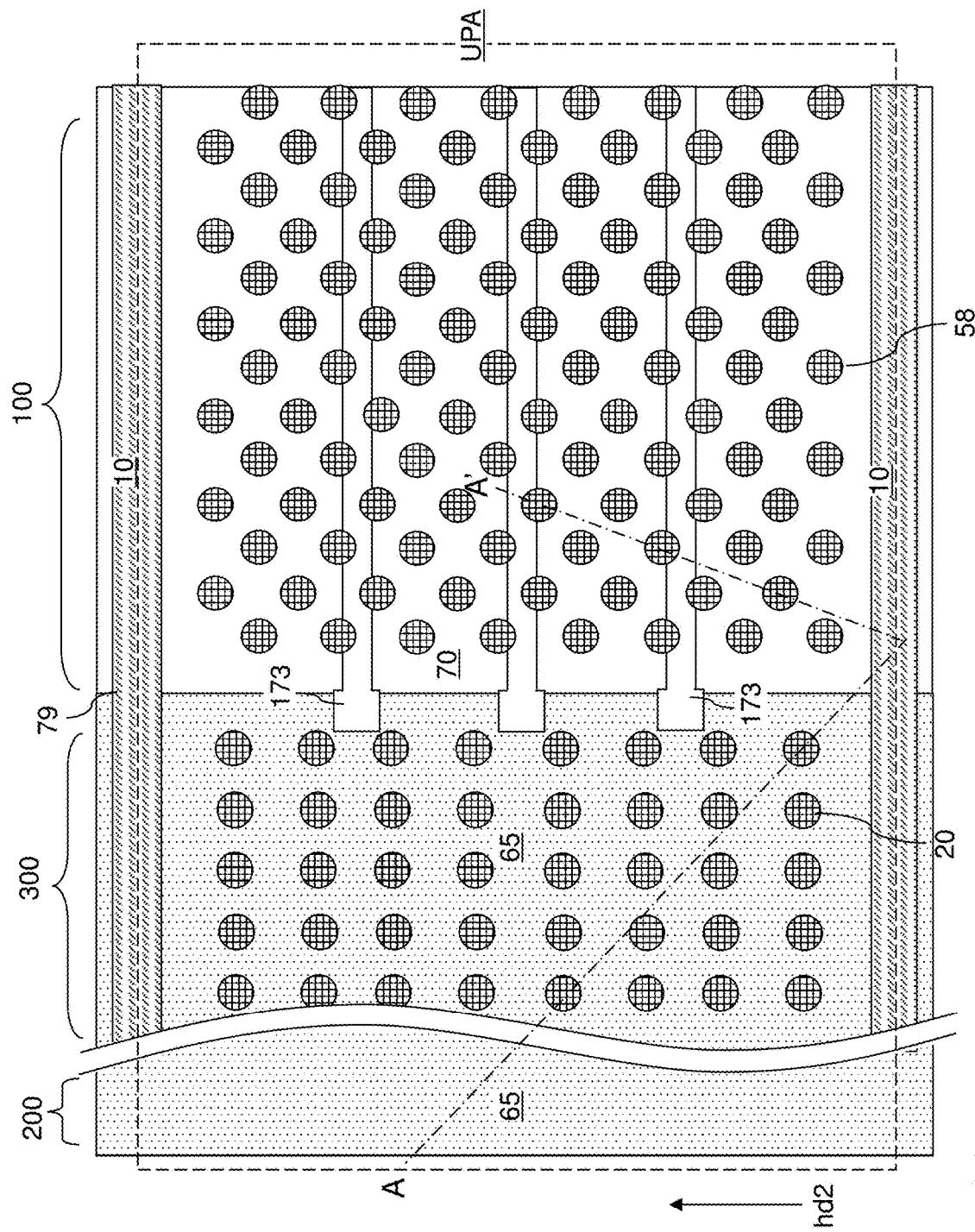
FIG. 13B is a top-down view of the exemplary structure along the vertical plane B-B' of FIG. 13A. The horizontal plane B-B' is the plane of the horizontal cross-sectional view of FIG. 13A.

Referring to FIG. 13, the metallic material of the continuous electrically conductive material layer 46L is etched back from inside the backside trenches 79, from inside the drain-select-level slit trenches 173, and from above the insulating cap layer 70, for example, by an isotropic wet etch, an anisotropic dry etch, or a combination thereof. The continuous electrically conductive material layer 46L includes at least one electrically conductive material that is deposited at peripheral regions of the backside trenches 79 and at peripheral regions of the drain-select-level slit trenches 173. Each remaining portion of the deposited metallic material in the word-line-level backside recesses 43 constitutes a word-line-level electrically conductive layer 46, which is a word line of the three-dimensional array of memory elements comprising a two-dimensional array and NAND strings. Each remaining portion of the deposited metallic material in the drain-select-level backside recesses 143 constitutes a drain-select-level electrode 146, which is a drain select gate electrode of the three-dimensional array of memory elements comprising a two-dimensional array and NAND strings. The word-line-level electrically conductive layers 46 and the drain-select-level electrodes 146 are collectively referred to as electrically conductive layers (46, 146). Each electrically conductive layer (46, 146) can be a conductive line structure. Thus, each sacrificial material layers (42, 142) are replaced with a respective electrically conductive layer (46, 146).

Each word-line-level electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each word-line-level electrically conductive layer 46 are the control gate electrodes for the vertical memory devices including the memory stack structures 55. In other words, each word-line-level electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. While the present disclosure is described employing an embodiment in which the backside blocking dielectric layer 44 is removed from inside the backside trenches 79 and the drain-select-level slit trenches 173, embodiments are expressly contemplated herein in which the backside blocking dielectric layer 44 is removed in a subsequent processing step, or is employed as an inter-select-gate dielectric.

Figure 14:
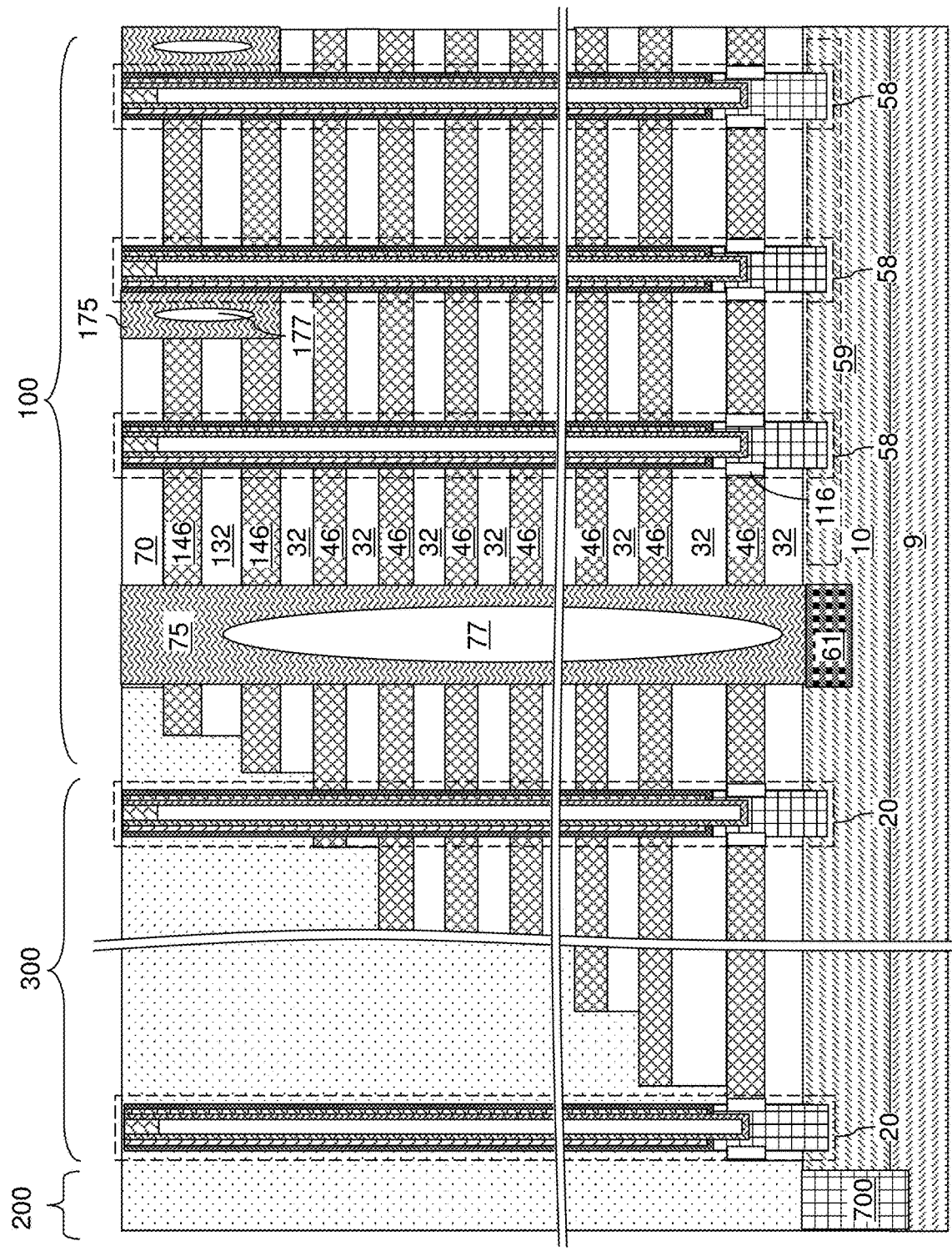
FIG. 14 is a horizontal cross-sectional view of the exemplary structure after formation of sacrificial trench fill material portions according to an embodiment of the present disclosure.

Referring to FIG. 14, a sacrificial trench fill material can be deposited in the backside trenches 79 and the drain-select-level slit trenches 173. The sacrificial trench fill material can include any material that can be removed selective to the materials of the insulating layers (32, 132), the electrically conductive layers (46, 146), the insulating cap layer 70, and the semiconductor material layer 10. For example, the sacrificial trench fill material can include a material such as amorphous carbon, diamond-like carbon, organosilicate glass, borosilicate glass, amorphous silicon, a silicon-germanium alloy, or a combination thereof. In one embodiment, the sacrificial trench fill material may be deposited anisotropically in order to form voids (77, 177) within the backside trenches 79 and within the drain-select-level slit trenches 173. Each portion of the sacrificial trench fill material that fills a backside trench 79 comprises a sacrificial backside trench fill material portion 75, which may include a void 77 therein. Each portion of the sacrificial trench fill material that fills a drain-select-level slit trench 173 comprises a sacrificial slit trench fill structure 175, which may include a void 177 therein.

Figure 15:
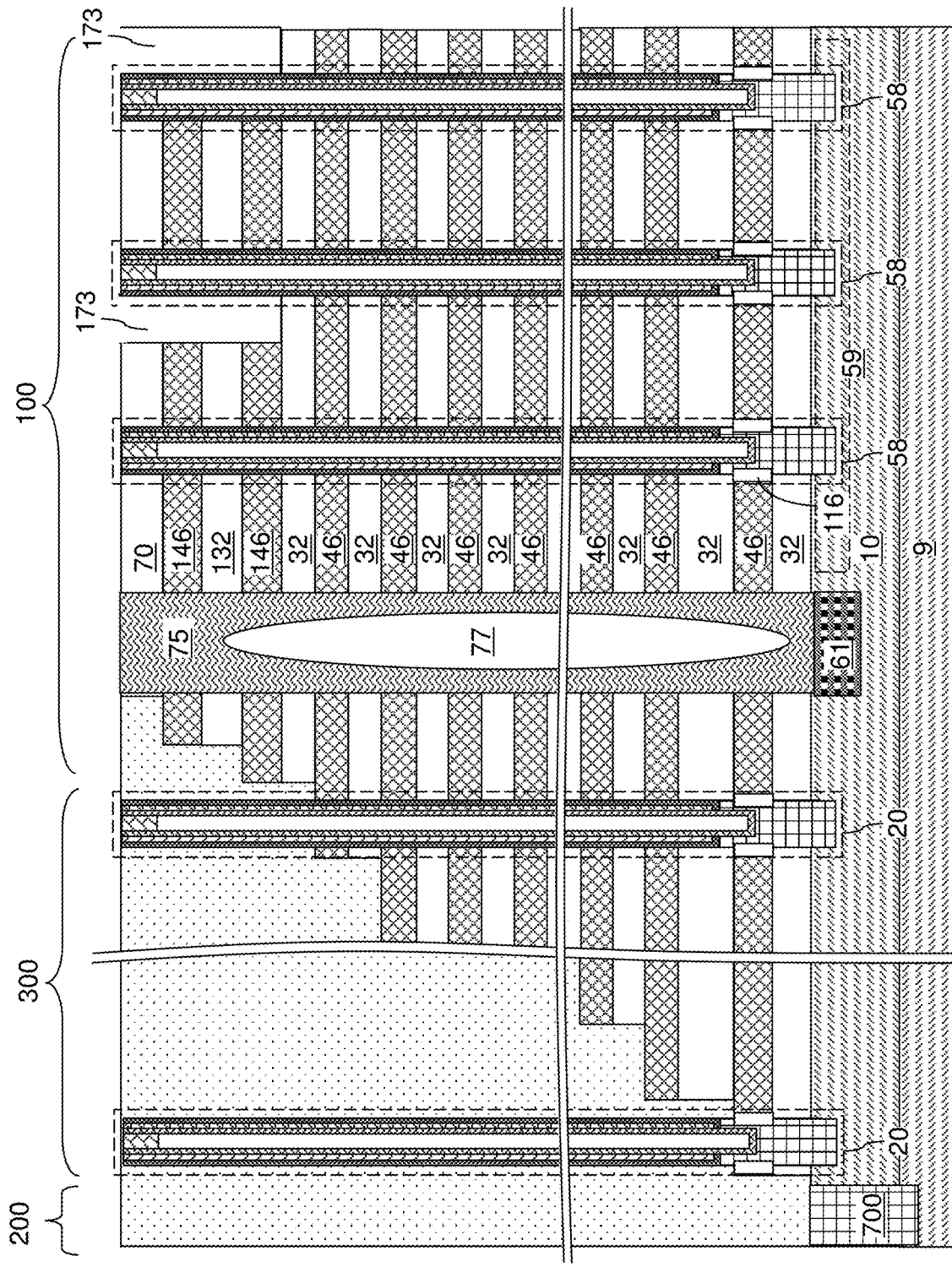
FIG. 15 is a horizontal cross-sectional view of the exemplary structure after removal of the drain-select-level trench fill material portions according to an embodiment of the present disclosure.

Referring to FIG. 15, a photoresist layer (not shown) may be applied over the insulating cap layer 70, and can be lithographically patterned to form openings over areas of the sacrificial slit trench fill structures 175 while masking the sacrificial backside trench fill material portions 75. An etch process that etches the material of the sacrificial slit trench fill structures 175 selective to the materials of the insulating cap layer 70, the drain-select-level insulating plates 142, and the drain-select-level electrodes 146 can be performed to remove the sacrificial slit trench fill structures 175. The volumes of the drain-select-level slit trenches 173 become empty. In an alternative embodiment, backside trench fill material portions 75 and the sacrificial slit trench fill structures 175 may be omitted, and a photoresist layer may be formed over the backside trenches 79 at this step.

Figure 16:
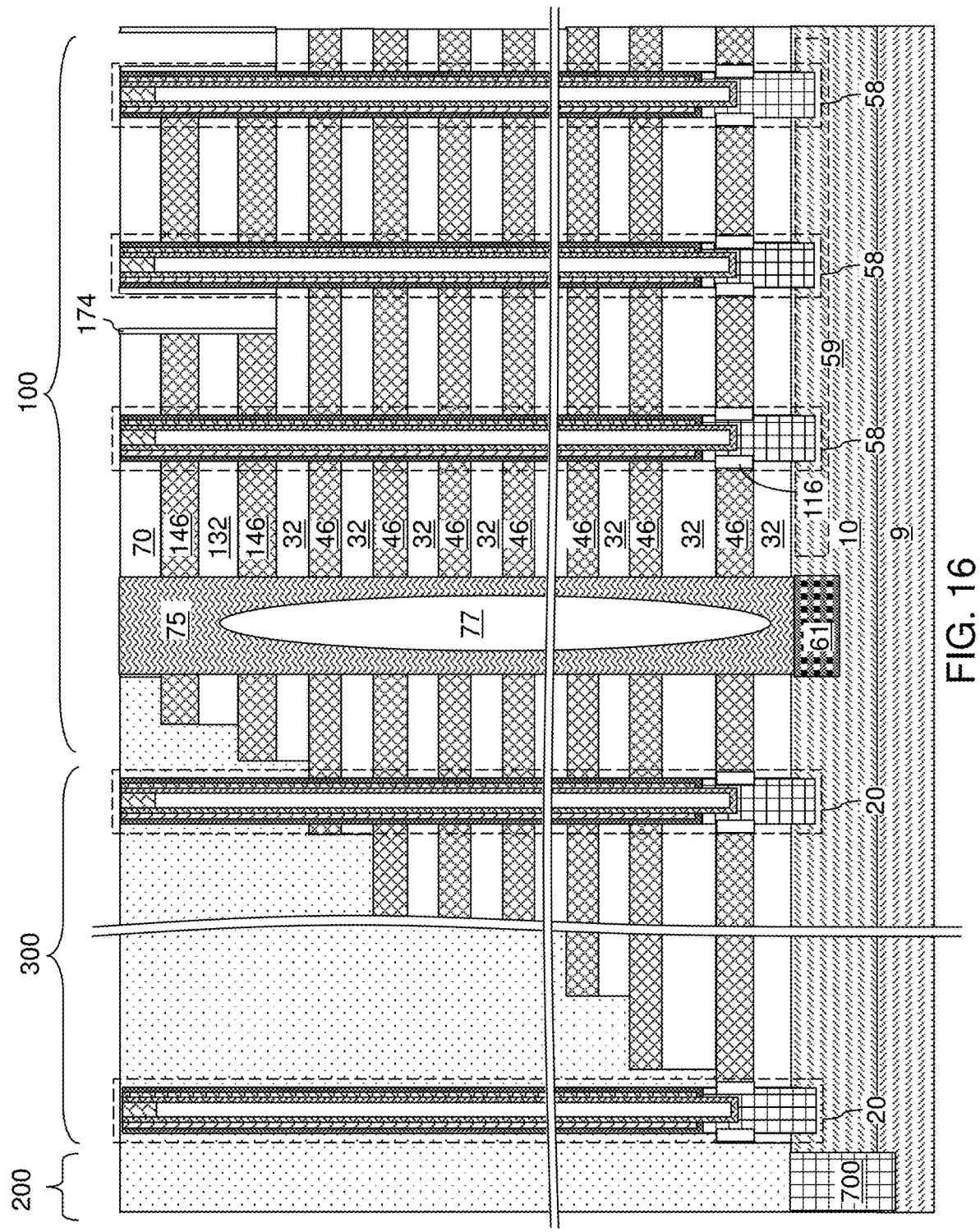
FIG. 16 is a horizontal cross-sectional view of the exemplary structure after formation of inter-select-gate dielectrics according to an embodiment of the present disclosure.

Referring to FIG. 16, a suitable surface clean process can be performed, and a gate dielectric material can be conformally deposited on the physically exposed surfaces of the drain-select-level insulating plates 142, the drain-select-level electrodes 146, the topmost one of the word-line-isolation insulating layers 32, and the insulating cap layer 70. The deposited gate dielectric material may include any gate dielectric material known in the art. For example, the deposited gate dielectric material may include a silicon oxide material formed by thermal decomposition of tetraethylorthosilicate (TEOS) and/or a dielectric metal oxide such as aluminum oxide or hafnium oxide, or any other suitable dielectric metal oxide material.

An optional anisotropic etch process can be performed to remove horizontal portions of the gate dielectric material. Each remaining vertically-extending portion of the gate dielectric material constitutes an inter-select-gate dielectric 174, which is formed between a laterally neighboring pair of drain-select-level electrodes 146. In one embodiment, each inter-select-gate dielectric 174 can have a tubular configuration, i.e., may be topologically homeomorphic to a torus and have a uniform thickness between an inner sidewall and an outer sidewall. The thickness of each inter-select-gate dielectric 174 may be in a range from 1 nm to 10 nm, such as from 1.5 nm to 6 nm, although lesser and greater thicknesses may also be employed. Alternatively, the anisotropic etch process may be omitted and inter-select-gate dielectric 174 has a bottom surface which contacts the topmost word-line-level insulating layer 32.

The inter-select-gate dielectrics 174 can be formed at peripheral regions of drain-select-level slit trenches 173 after formation of the drain-select-level electrodes 146. Each of the inter-select-gate dielectrics 174 has a pair of outer sidewalls that extend along the first horizontal direction hd1 and laterally undulate along the second horizontal direction hd2. Each of the pair of outer sidewalls of each inter-select-gate dielectric 174 comprises a laterally alternating sequence of concave cylindrical sidewall segments and planar vertical sidewall segments.

Figure 17A:
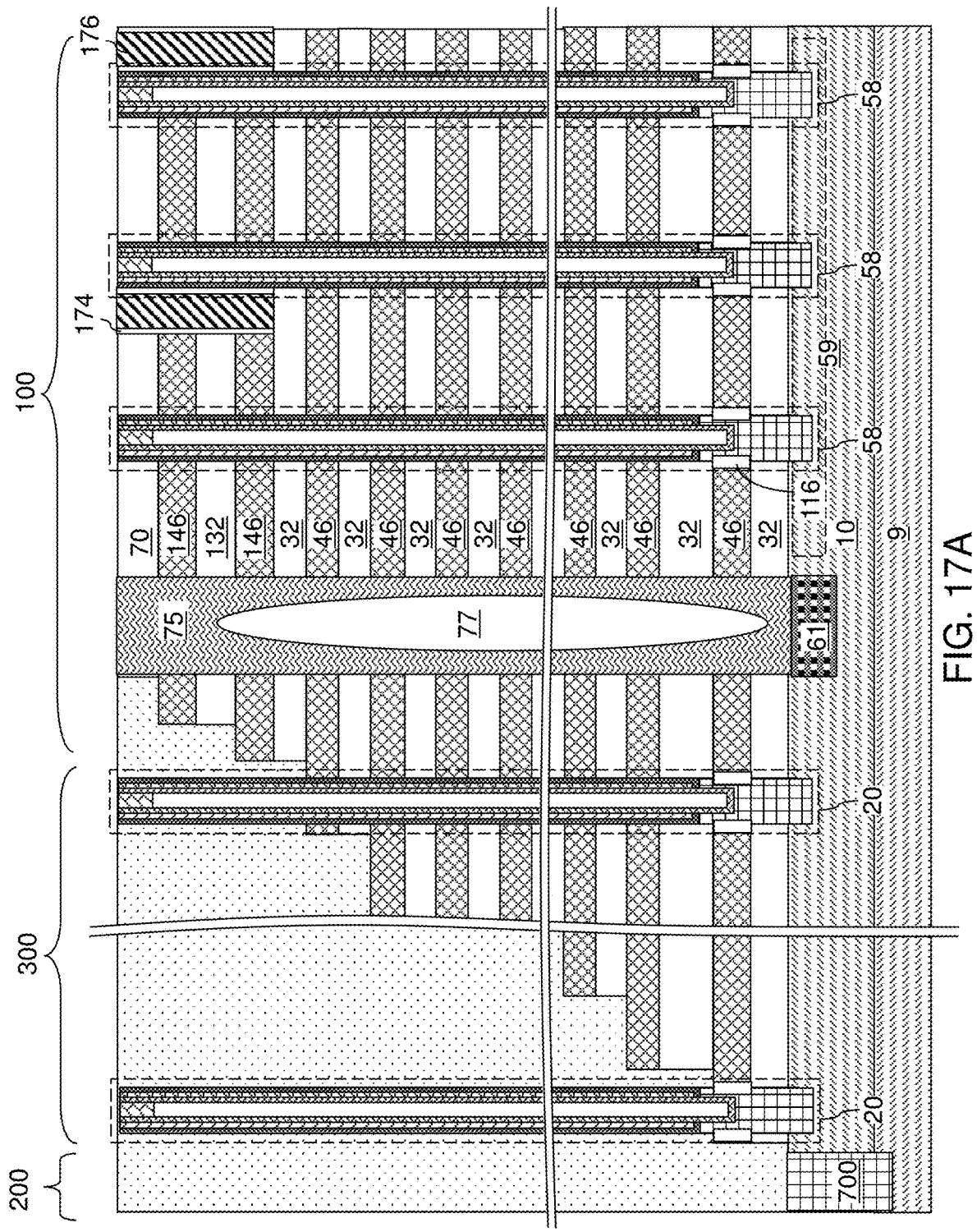
FIG. 17A is a horizontal cross-sectional view of the exemplary structure after formation of inter-select-gate electrodes according to an embodiment of the present disclosure.
Figure 17B:
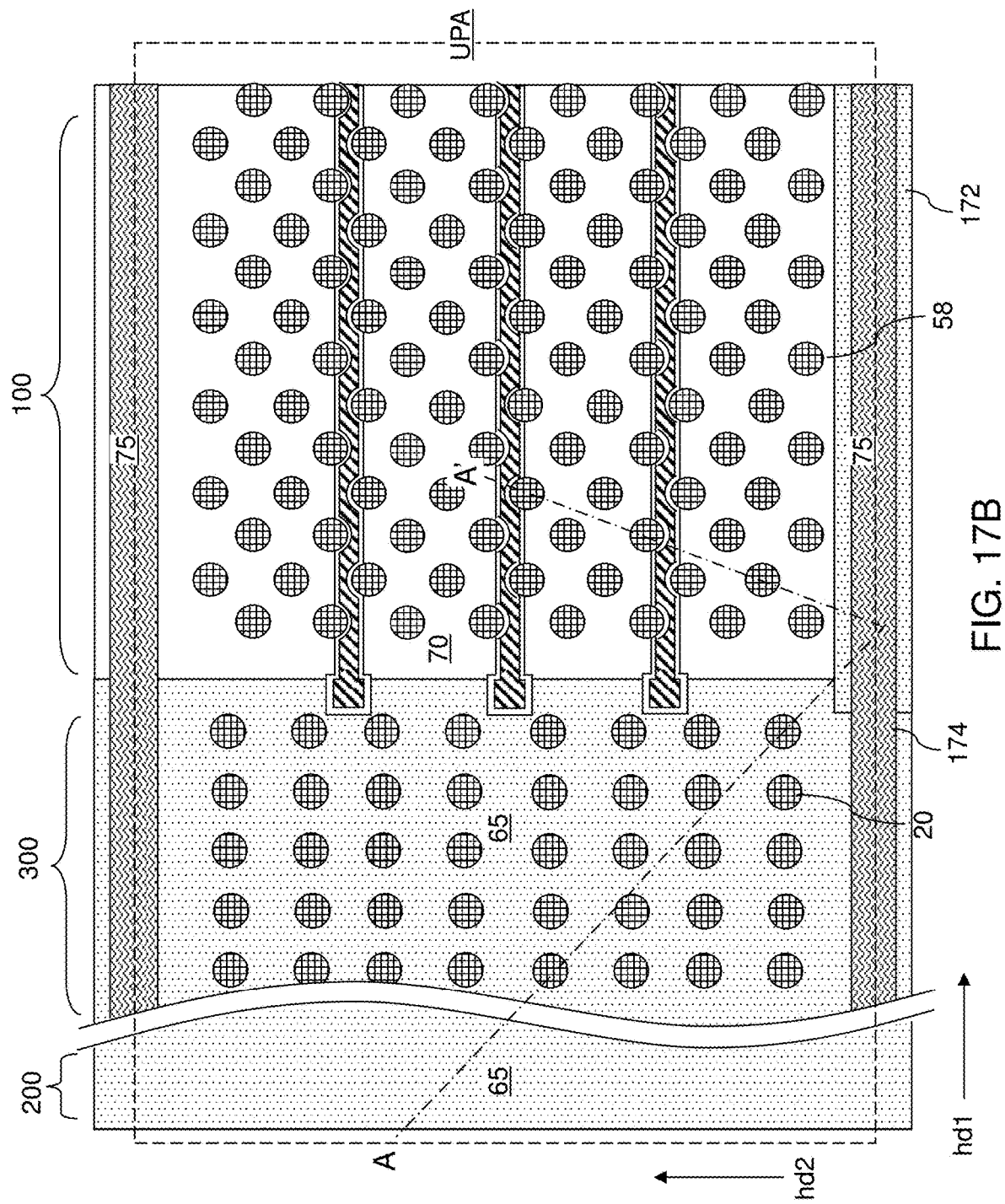
FIG. 17B is a top-down view of the exemplary structure along the vertical plane B-B' of FIG. 17A. The horizontal plane B-B' is the plane of the horizontal cross-sectional view of FIG. 17A.

Referring to FIGS. 17A and 17B, at least one conductive material can be deposited in the drain-select-level slit trenches 173 on the inter-select-gate dielectrics 174. The at least one conductive material can include, for example, a conductive metallic nitride material such as TiN, TaN, or WN. Optionally, the at least one conductive material can include a metallic fill material such as W, Cu, Co, Mo, Ru, or a combination thereof.

Portions of the at least one conductive material located outside the volumes of the drain-select-level slit trenches 173 can be removed by a planarization process. For example, portions of the at least one conductive material located above the horizontal plane including the top surface of the insulating cap layer 70 can be removed by chemical mechanical planarization and/or by a recess etch process. Remaining portions of the at least one conductive material within the volumes of the drain-select-level slit trenches 173 comprise inter-select-gate electrodes 176. A combination of an inter-select-gate dielectric 174 and an inter-select-gate electrode 176 is formed in each of the drain-select-level slit trenches 173.

Each of the inter-select-gate electrodes 176 comprises a pair of laterally-undulating sidewalls that extend along the first horizontal direction hd1. Each laterally-undulating sidewall of the inter-select-gate electrodes 176 laterally extend along the first horizontal direction hd1 and laterally undulate along the second horizontal direction hd2. Each of the pair of laterally-undulating sidewalls comprises concave cylindrical sidewall segments that are interlaced with planar vertical sidewall segments. Each of the concave cylindrical sidewall segments is laterally spaced from a sidewall of a most proximal one of the memory stack structures 55 by a uniform thickness that is the same as a thickness of the inter-select-gate dielectrics 174.

In one embodiment, each of the inter-select-gate electrodes 176 laterally extends along the first horizontal direction hd1 with undulation in width between a neighboring pair of rows of memory stack structures 55. The memory stack structures 55 within each row are arranged along the first horizontal direction hd1. The neighboring pair of rows of memory stack structures 55 is laterally spaced apart along the second horizontal direction hd2, which is perpendicular to the first horizontal direction hd1. The center-to-center pitch between neighboring rows of memory opening fill structures 58 along the second horizontal direction hd2 can be the same for all rows of memory opening fill structures 58 (and thus, for all rows of memory stack structures 55).

A plurality of drain-select-level electrodes 146 are laterally spaced apart from each other along the second horizontal direction hd2 and overlie the word-line-level alternating stack (32, 46) including the word-line-isolation insulating layers 32 and word-line-level electrically conductive layers 46, i.e., the word lines. Memory stack structures 55 vertically extend through the word-line-level alternating stack (32, 46) and the plurality of drain-select-level electrodes 146. Each of the memory stack structures 55 comprises a respective vertical semiconductor channel 60 laterally surrounded by a respective memory film 50. Inter-select-gate electrodes 176 can be located between a respective neighboring pair of the plurality of drain-select-level electrodes 146, but are not electrically connected to the drain-select-level electrodes 146. The inter-select-gate electrodes 176 do not laterally surround any of the memory stack structures 55, as shown in FIG. 17B. The inter-select-gate dielectrics 174 can be located between each of the inter-select-gate electrodes 176 and a neighboring one of the drain-select-level electrode 146. In one embodiment, the azimuthal extent of any inter-select-gate electrode 176 around a vertical axis passing through a geometrical center of any memory opening fill structure 58 can be less than 180 degrees.

In one embodiment, each of the inter-select-gate electrodes 176 laterally contacts a respective one of the inter-select-gate dielectrics 174. In one embodiment, each of the inter-select-gate electrodes 176 is laterally surrounded by a respective one of the inter-select-gate dielectrics 174. Each of the plurality of drain-select-level electrodes 146 laterally surrounds at least one row of memory stack structures 55. Generally, the drain-select-level electrodes 146 laterally encloses each row of memory stack structures 55 within the second subset of memory opening fill structures 58 that do not adjoin any of the drain-select-level slit trenches 173, and do not laterally enclose any row of memory stack structures 55 within the first subset of memory opening fill structures 58 that contact any of the drain-select-level slit trenches 173. Each of the inter-select-gate electrodes 176 can be located between a respective neighboring pair of rows of memory stack structures 55 that are laterally spaced apart along the second horizontal direction hd2.

Each of the pair of laterally-undulating sidewalls of an inter-select-gate electrodes 176 comprises concave cylindrical sidewall segments that are laterally spaced along the first horizontal direction hd1 and planer vertical sidewall segments laterally extending along the first horizontal direction hd1 and connecting the concave cylindrical sidewall segments. The plurality of drain-select-level electrodes 146 can be located at multiple levels having different vertical separation distances from the substrate (9, 10), and each of the inter-select-gate dielectrics 174 can contact a respective vertical stack of drain-select-level electrodes 146 located at the multiple levels.

Figure 18:
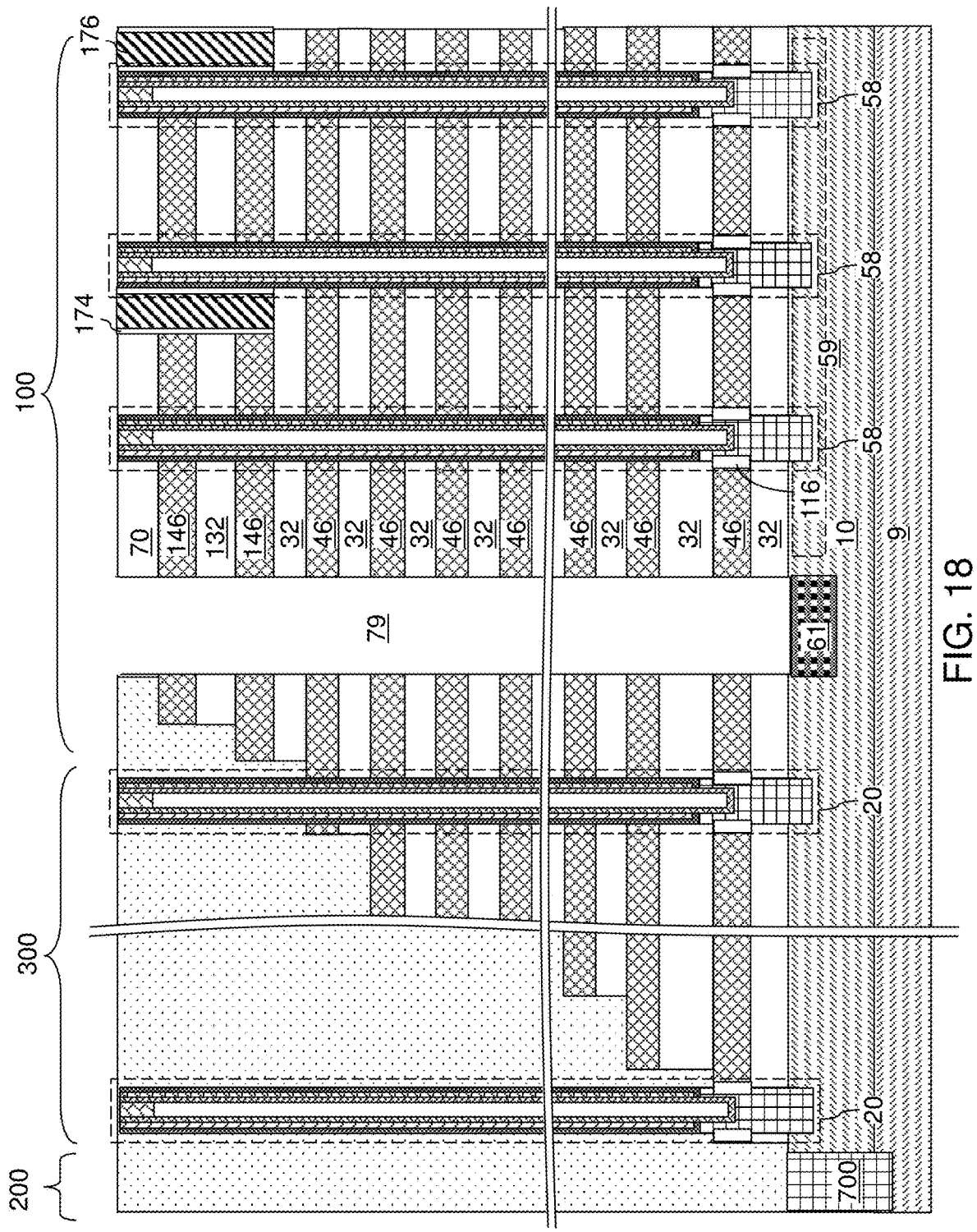
FIG. 18 is a horizontal cross-sectional view of the exemplary structure after removal of the backside trench fill material portions according to an embodiment of the present disclosure.

Referring to FIG. 18, an etch process that etches the material of the sacrificial backside trench fill structures 75 selective to the materials of the insulating cap layer 70, the drain-select-level insulating plates 142, the drain-select-level electrodes 146, the inter-select-gate dielectrics 174, and the inter-select-gate electrodes 176 can be performed to remove the sacrificial backside trench fill structures 75. The volumes of the backside trenches 79 become empty. Alternatively, if the sacrificial backside trench fill structures 75 are not initially formed and a photoresist layer is located over the backside trench fill structures 75, then the photoresist layer is removed at this step.

Figure 19A:
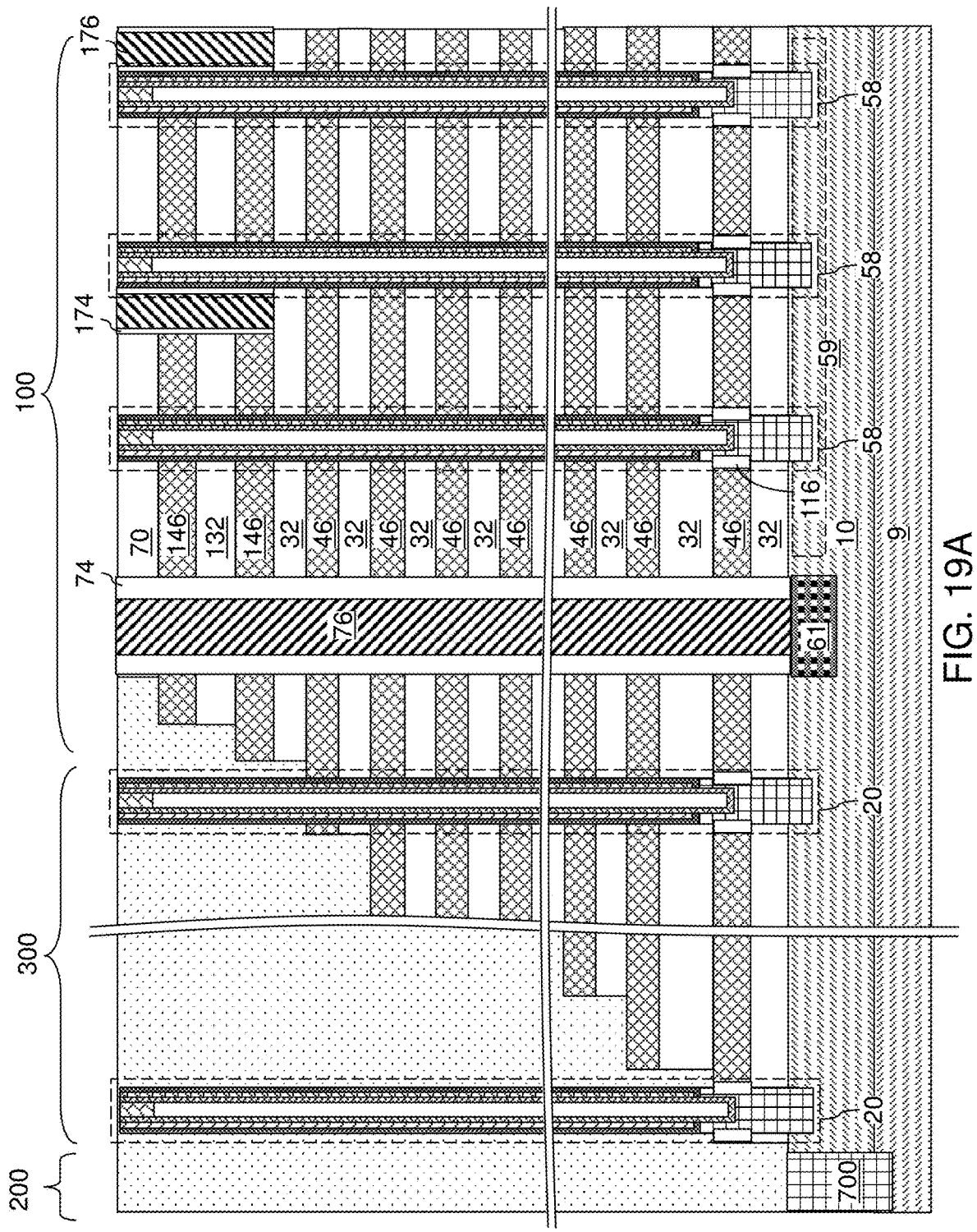
FIG. 19A is a horizontal cross-sectional view of the exemplary structure after formation of backside trench fill structures according to an embodiment of the present disclosure.
Figure 19B:
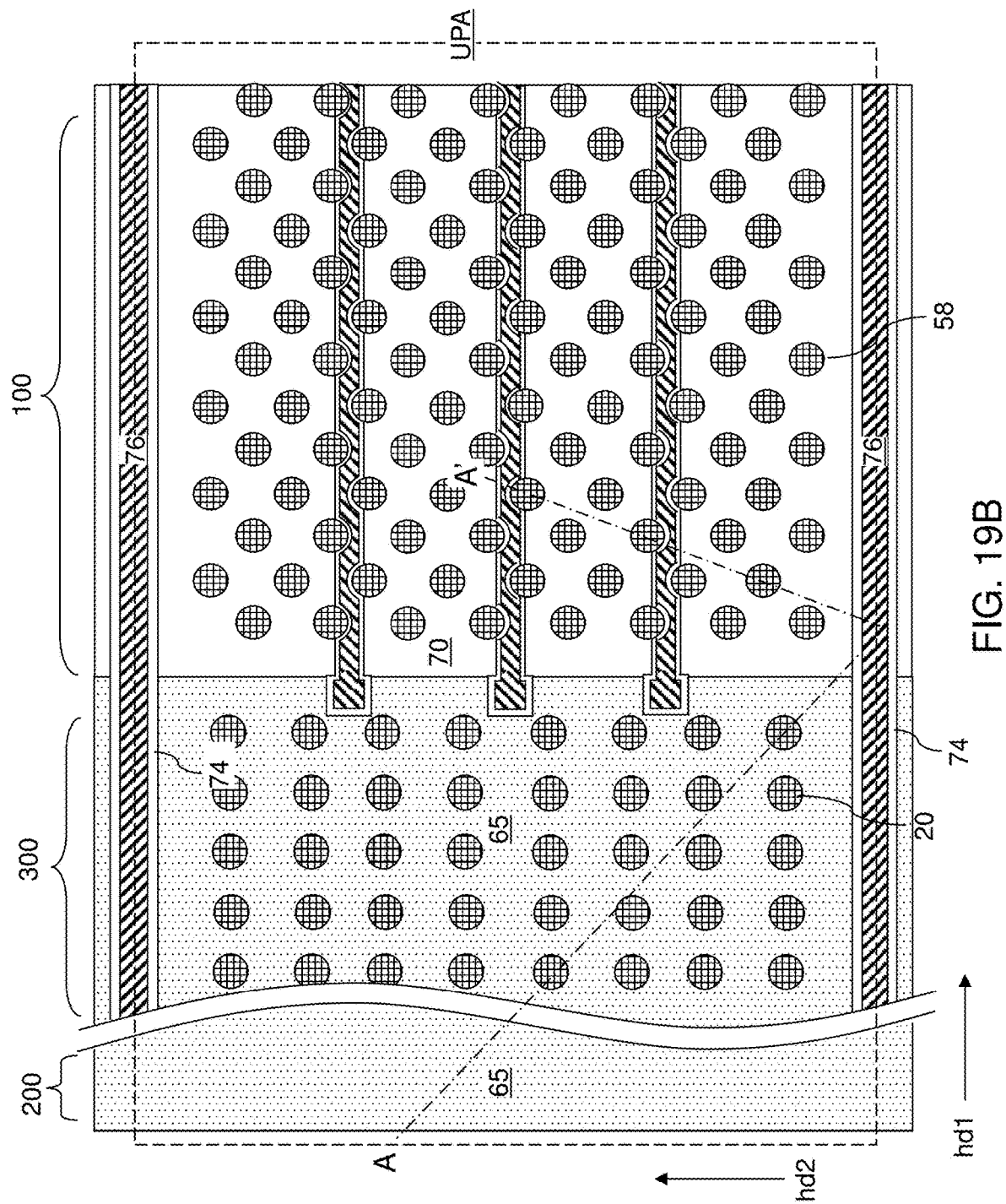
FIG. 19B is a top-down view of the exemplary structure along the vertical plane B-B' of FIG. 19A. The horizontal plane B-B' is the plane of the horizontal cross-sectional view of FIG. 19A.
Figure 20A:
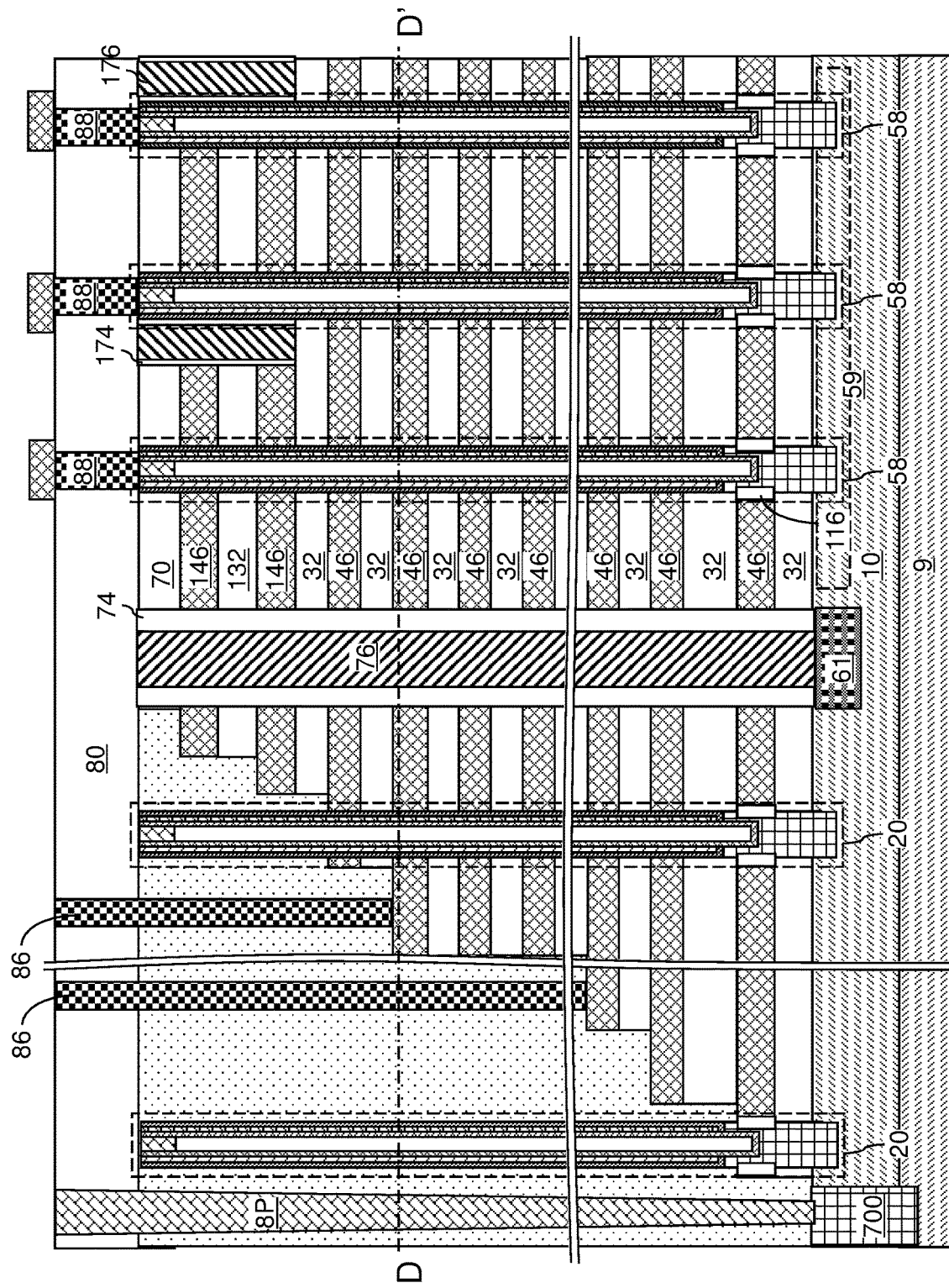
FIG. 20A is a horizontal cross-sectional view of the exemplary structure after formation of various contact via structures according to an embodiment of the present disclosure.
Figure 20B:
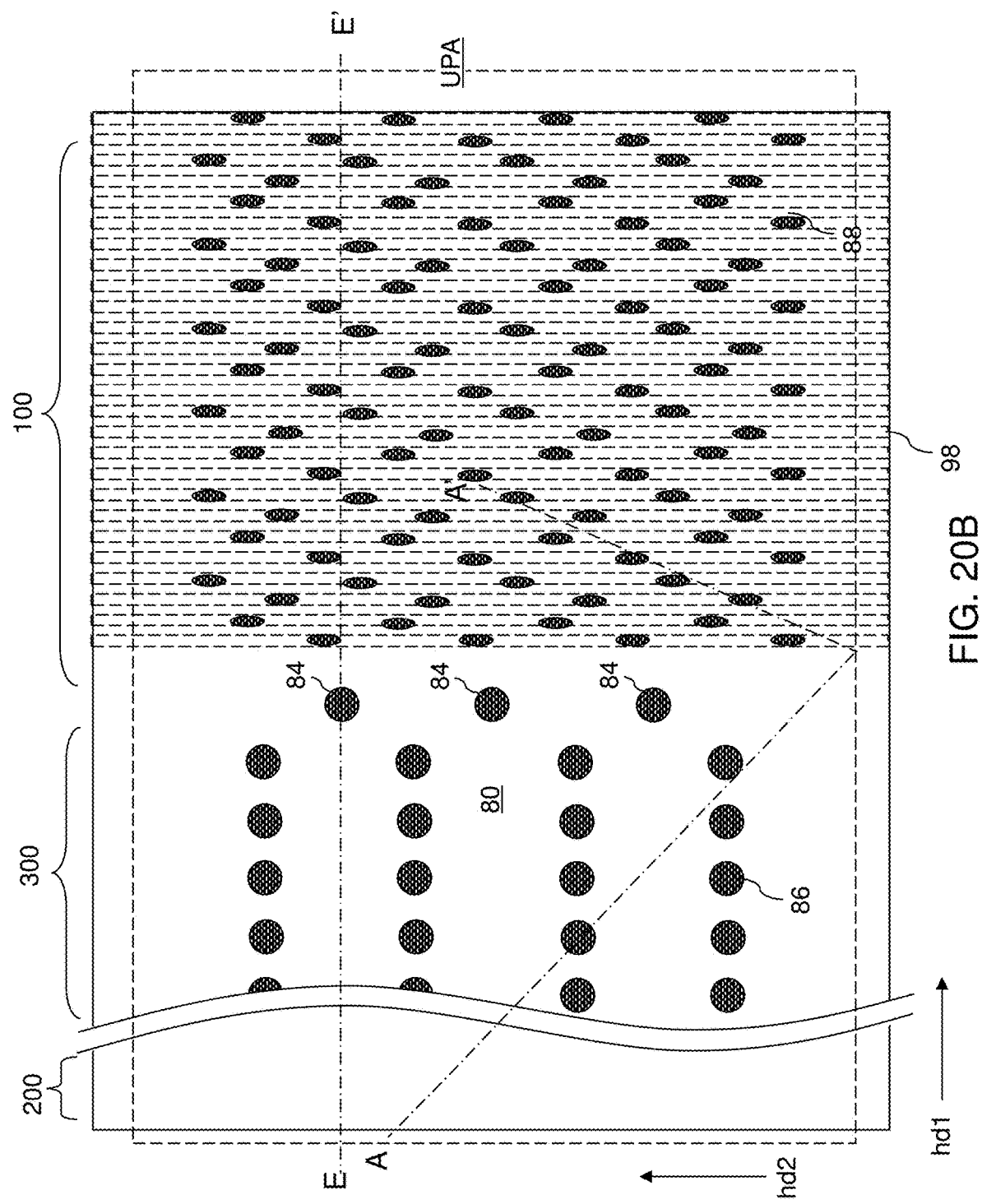
FIG. 20B is a top-down, partial see-through view of the exemplary structure of FIG. 20A.
Figure 20C:
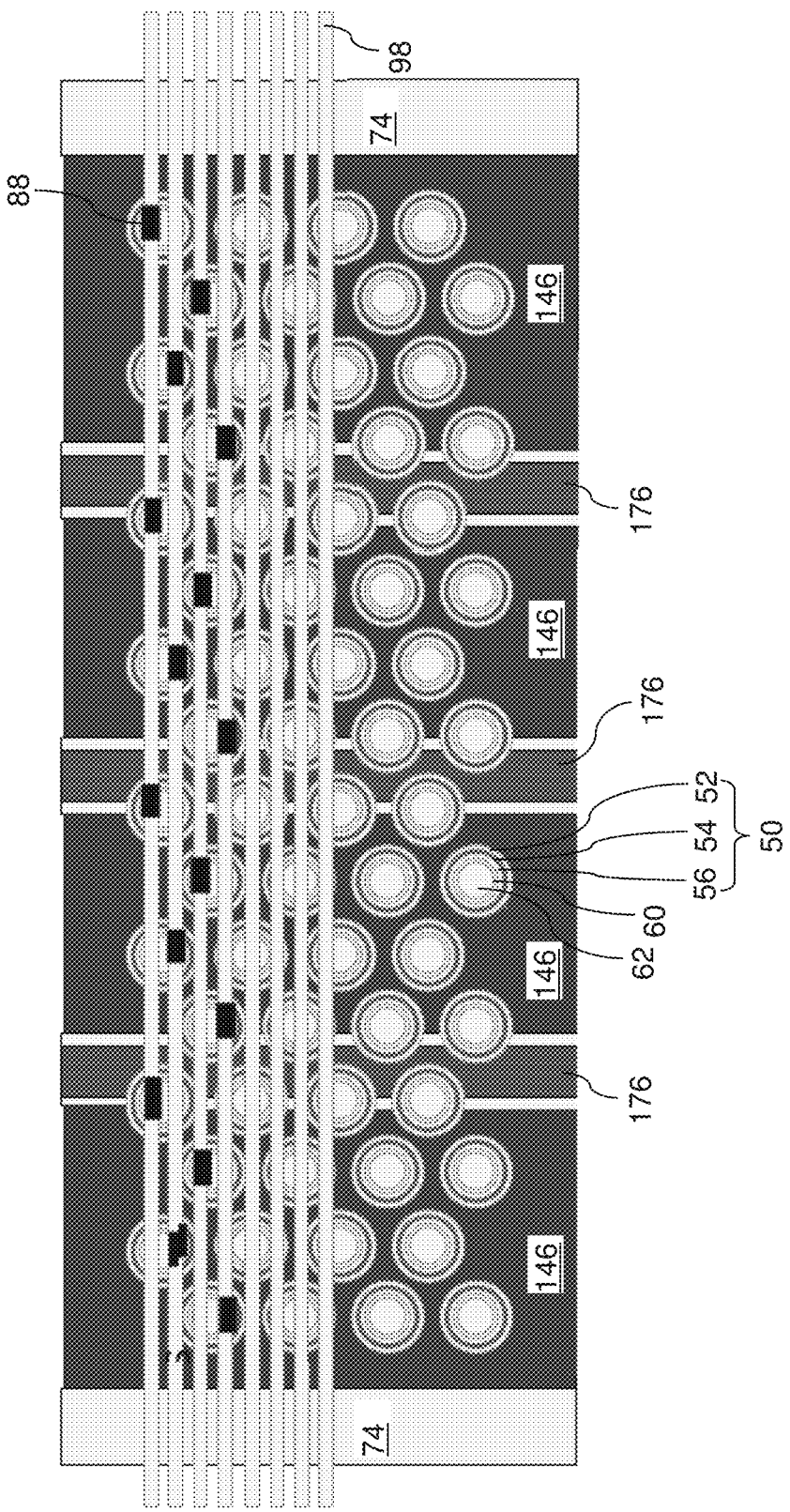
FIG. 20C is a top-down, partial see-through view of a portion of the exemplary structure FIGS. 20A and 20B.
Figure 20D:
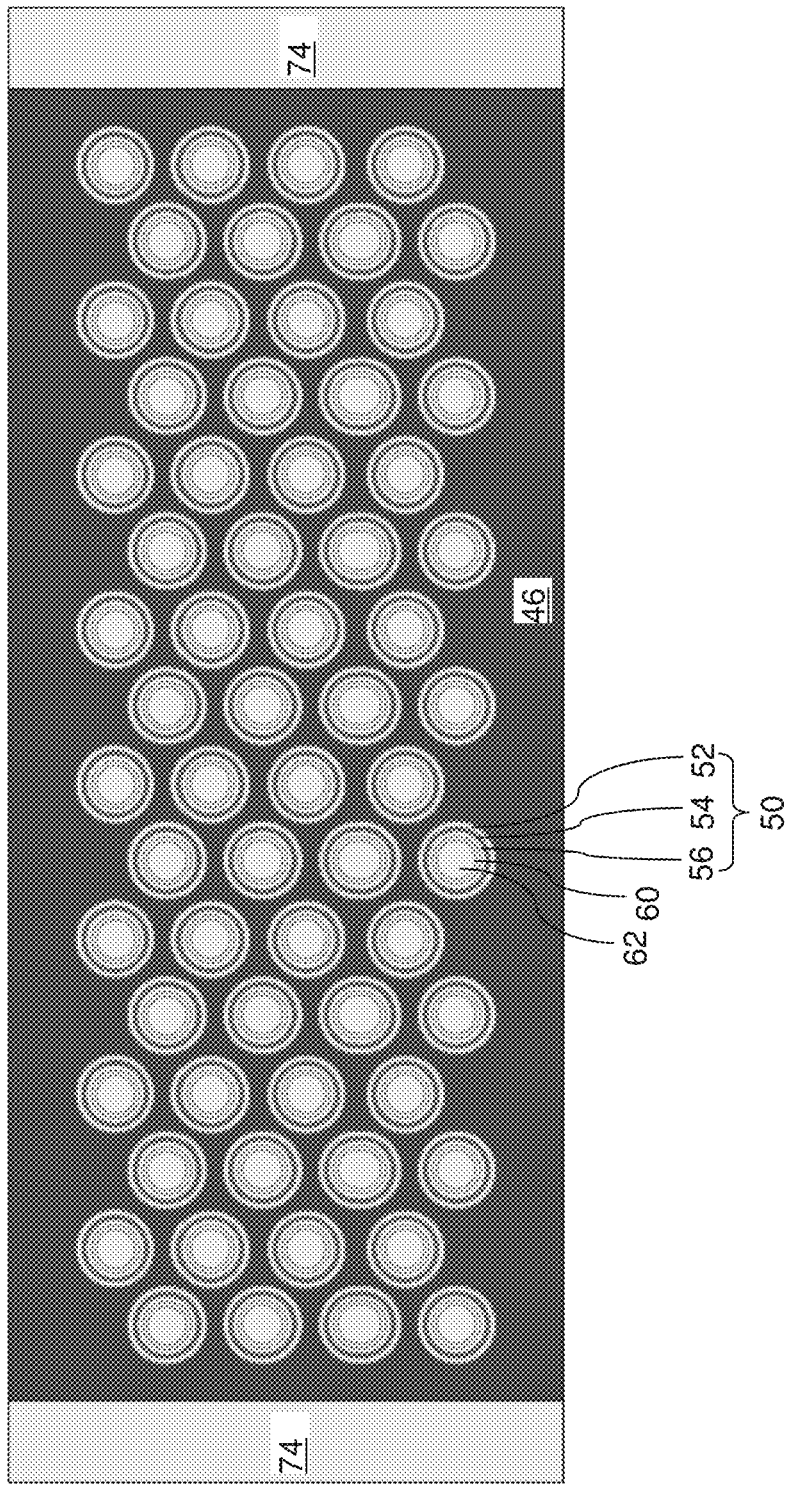
FIG. 20D is a horizontal cross-sectional view of a portion of the exemplary structure along the horizontal plane D-D of FIG. 20A.
Figure 20E:
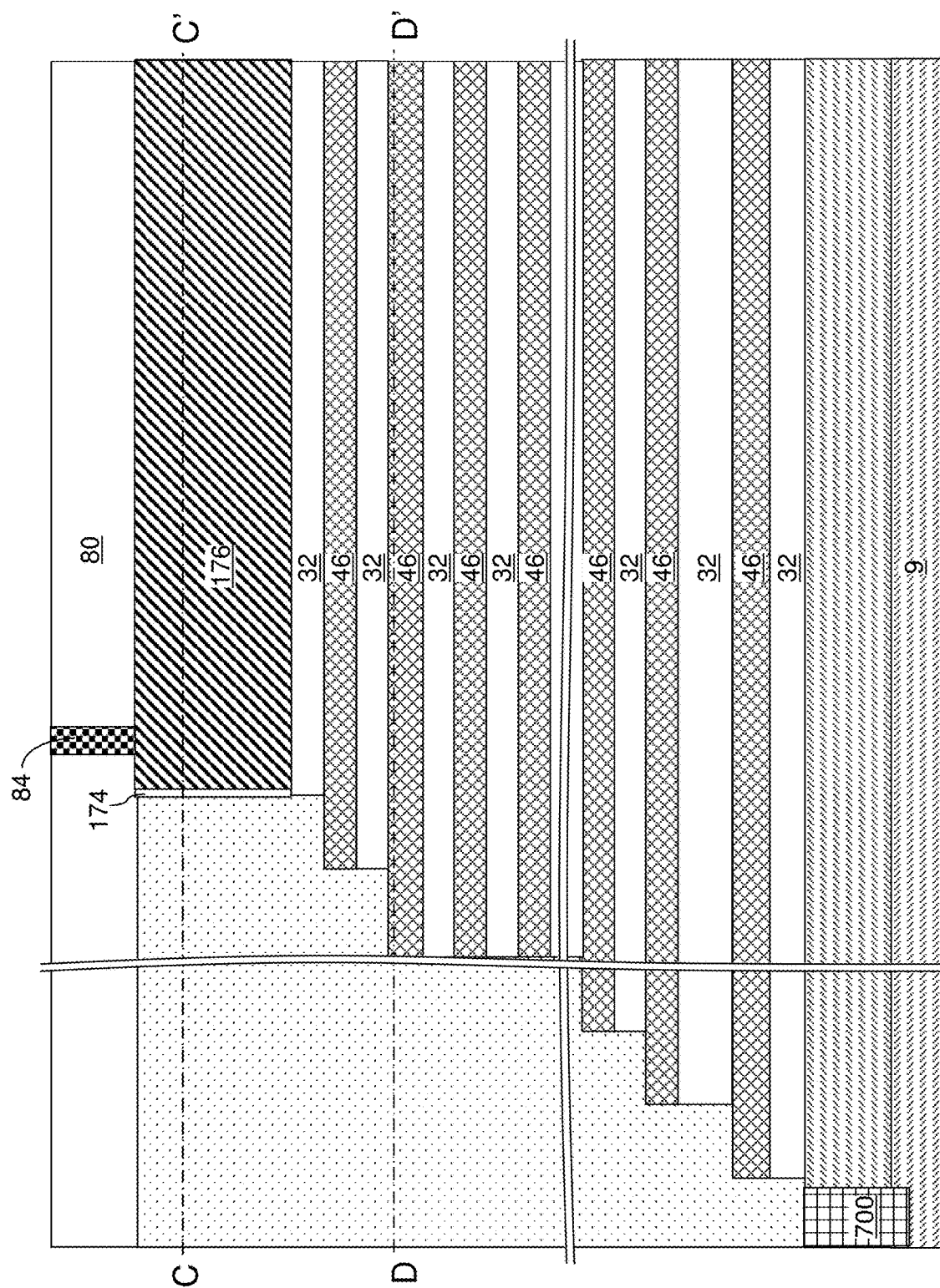
FIG. 20E is a vertical cross-sectional view of the exemplary structure along the horizontal plane E-E of FIG. 20B.

Referring to FIGS. 19A and 19B, an insulating material layer can be formed in the backside trenches 79 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 3 nm to 60 nm, although lesser and greater thicknesses can also be employed.

An anisotropic etch is performed to remove horizontal portions of the insulating material layer from above the insulating cap layer 70 and at the bottom of each backside trench 79. Each remaining portion of the insulating material layer constitutes an insulating spacer 74. A backside cavity is present within a volume surrounded by each insulating spacer 74. A top surface of a source region 61 can be physically exposed at the bottom of each backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective backside cavity. The contact via structures 76 can be formed by depositing at least one conductive material in the remaining unfilled volume of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the insulating cap layer 70 as a stopping layer. If chemical mechanical planarization (CMP) process is employed, the insulating cap layer 70 can be employed as a CMP stopping layer. Each remaining continuous portion of the at least one conductive material in the backside trenches 79 constitutes a backside contact via structure 76. Each backside contact via structure 76 extends through the word-line-level alternating stack (32, 46) and the drain-select-level alternating stack (132, 146), and contacts a top surface of the source region 61. Each contiguous combination of an insulating spacer 74 and a backside contact via structure 76 can constitute a backside trench fill structure (74, 76). Generally, a backside trench fill structure includes an insulating material portion (such as an insulating spacer 74 of an insulating fill material portion that fills an entire volume of a backside trench 79), and may, or may not, include a backside contact via structure 76. For example, if the driver circuit semiconductor devices 700 are formed in the memory array region 100 in a CMOS under array configuration, then the backside contact via structure 76 may be omitted and the entire backside trench is filled with the insulating spacer 74.

A pair of backside trench fill structures (74, 76) can be located on sidewalls of the word-line-level alternating stack (32, 46) and the plurality of drain-select-level electrodes 146. In one embodiment, each of the pair of backside trench fill structures (74, 76) can comprise an insulating spacer 74 in contact with the sidewalls of the word-line-level alternating stack (32, 46) and the plurality of drain-select-level electrodes 146, and a backside contact via structure 76 in contact with a respective source region 61 embedded in the substrate (9, 10).

Referring to FIGS. 20A-20D, a contact-level dielectric layer 80 can be formed over the insulating cap layer 70 and over the inter-select-gate electrodes 176. The contact-level dielectric layer 80 includes a dielectric material such as silicon oxide. The thickness of the contact-level dielectric layer 80 can be in a range from 100 nm to 600 nm, although lesser and greater thicknesses can also be employed. Additional contact via structures (88, 86, 84, 8P) can be formed through the contact-level dielectric layer 80, and optionally through the retro-stepped dielectric material portion 65. For example, drain contact via structures 88 can be formed through the contact-level dielectric layer 80 on each drain region 63. Word line contact via structures 86 can be formed on the electrically conductive layers (46, 146) through the contact-level dielectric layer 80, and through the retro-stepped dielectric material portion 65. Inter-select-gate electrode contact via structures 84 can vertically extend through the contact-level dielectric layer 80, and can contact a top surface of a respective one of the inter-select-gate electrodes 176. Peripheral device contact via structures 8P can be formed through the retro-stepped dielectric material portion 65 directly on respective nodes of the peripheral devices.

Figure 21:
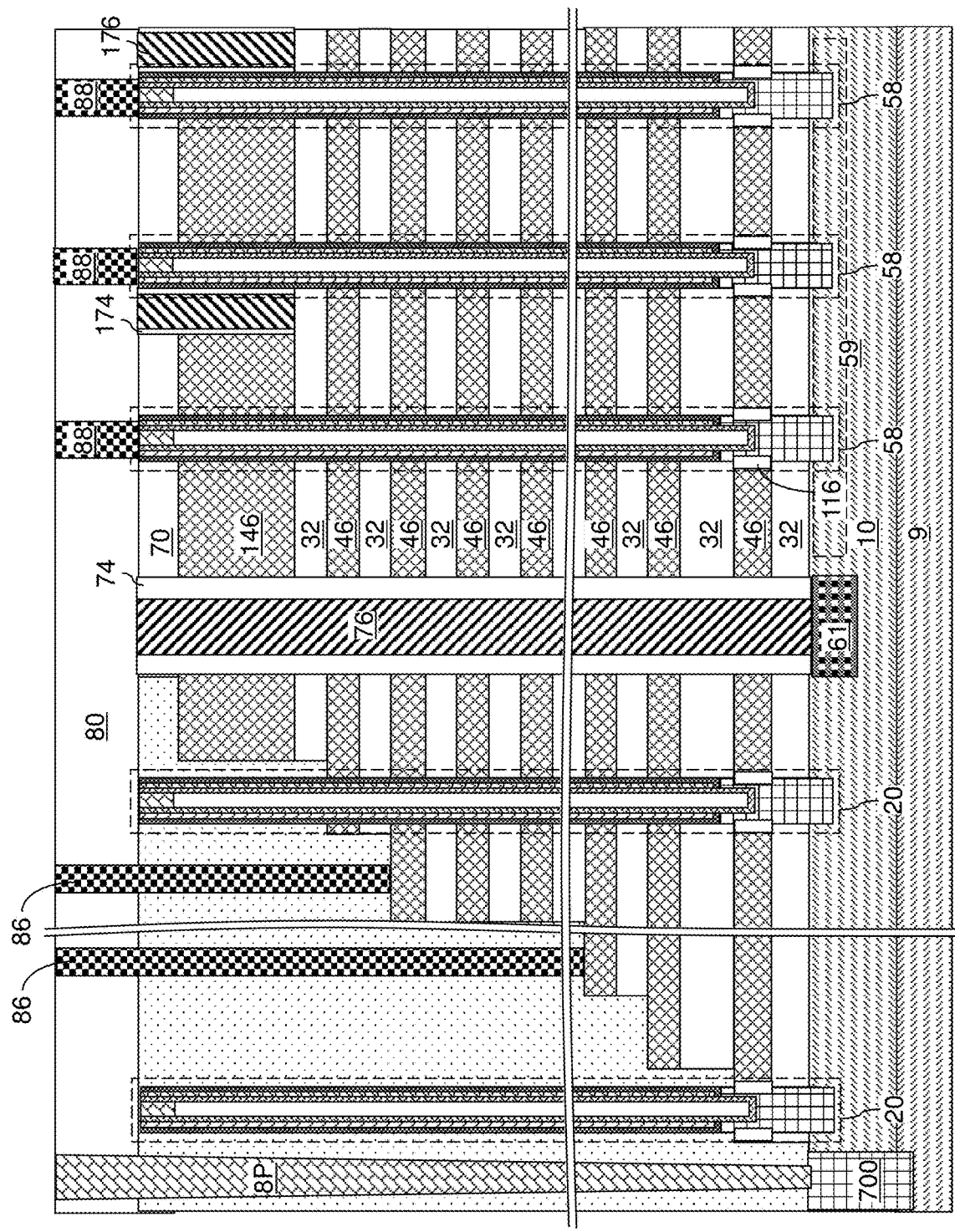
FIG. 21 is an alternative embodiment of the exemplary structure according to an embodiment of the present disclosure.

Referring to FIG. 21, is an alternative embodiment of the exemplary structure according to an embodiment of the present disclosure is illustrated. The alternative embodiment of the present disclosure can be derived from the exemplary structure of FIGS. 20A-20E by employing a single drain-select-level sacrificial material layer 142L in lieu of at least two drain-select-level sacrificial material layers 142L and at least one drain-select-level insulating layer 132L at the processing steps of FIG. 2. In this case, drain-select-level electrodes 146 can be formed in a single level directly on a top surface of a topmost one of the word-line-isolation insulating layers 32 and directly underneath a bottom surface of the insulating cap layer 70. The thickness of the drain-select-level electrodes 146 can be increased relative to thickness of the drain-select-level electrodes 146 of FIGS. 20A-20E to increase the conductivity.

Figure 22:
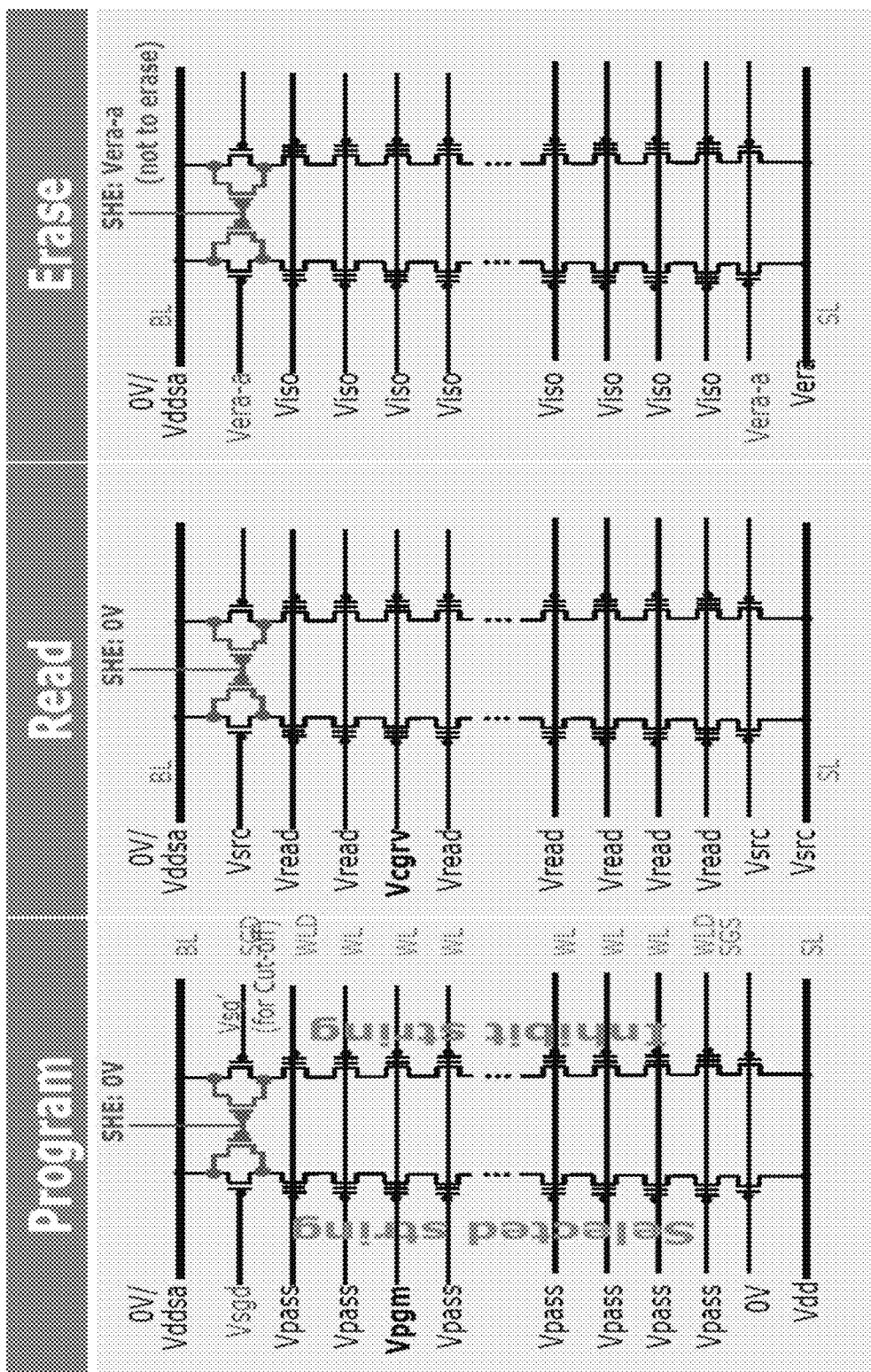
FIG. 22 illustrates circuit diagrams for a pair of vertical NAND strings during a programming operation, a read operation, and an erase operation according to an embodiment of the present disclosure.

Referring to FIG. 22, circuit diagrams for a pair of memory opening fill structures 58 that contact a common inter-select-gate dielectric 174 is illustrated. The common inter-select-gate dielectric 174 laterally surrounds an inter-select-gate electrode 176, which is labeled as SHE. The inter-select-gate electrode 176 (SHE) can be electrically biased at 0 V during the program operations and during the read operations. Thus, the inter-select-gate electrode 176 (SHE) does not affect the programming operation or the read operation. The inter-select-gate electrode 176 (SHE) of embodiments of the present disclosure can be advantageously employed during an erase operation to provide an erase voltage (Vera-a). Thus, the drain-select-level electrodes 146 (labeled SGD) and the inter-select-gate electrodes 176 (SHE) of a three-dimensional array of memory elements can be electrically biased with a same erase bias voltage during the erase operation to increase the erase efficiency. However, the inter-select-gate electrode 176 (SHE) is biased at a different voltage (i.e., separately) from the drain-select-level electrodes 146 during programming and reading steps.

Generally, a programming operation can be performed on a memory element within a selected memory stack structure 55 among the memory stack structures 55 of embodiments of the present disclosure by activating only one of the plurality of drain-select-level electrodes 146 and deactivating all of the inter-select-gate electrodes 176 (SHE). Thus, the inter-select-gate electrodes 176 are transparent to the programming operation, i.e., do not play an active role during the programming operation. Likewise, a read operation can be performed on a memory element within a selected memory stack structure 55 among the memory stack structures 55 of embodiments of the present disclosure by activating only one of the plurality of drain-select-level electrodes 146 and deactivating all of the inter-select-gate electrodes 176. Thus, the inter-select-gate electrodes 176 are transparent to the read operation, i.e., do not play an active role during the read operation. An erase operation can be performed on all memory elements within the memory stack structures 55 by activating all of the plurality of drain-select-level electrodes 146 and all of the inter-select-gate electrodes 176. In this case, the same erase voltage can be applied to the all of the plurality of drain-select-level electrodes 146 and all of the inter-select-gate electrodes 176. The portions of the vertical semiconductor channels located at the drain select levels can be uniformly electrically biased at the same voltage irrespective of the azimuthal angle around the vertical axis passing through the geometrical center of a respective memory opening fill structure 58.

Referring to all drawings and according to various embodiments of the present disclosure, a three-dimensional memory device is provided, which comprises: an alternating stack of word-line-isolation insulating layers 32 and word-line-level electrically conductive layers 46 located over a substrate (9, 10), a plurality of drain-select-level electrodes 146 that are laterally spaced apart from each other overlying the alternating stack (32, 46), memory stack structures 55 comprising a respective vertical semiconductor channel 60 laterally surrounded by a respective memory film 50 and vertically extending through the alternating stack (32, 46) and the plurality of drain-select-level electrodes 146, inter-select-gate electrodes 176 located between a respective neighboring pair of the drain-select-level electrodes 146; and inter-select-gate dielectrics 174 located between each of the inter-select-gate electrodes 176 and a neighboring one of the drain-select-level electrodes 146. The inter-select-gate electrodes 176 are not electrically or physically connected to the drain-select-level electrodes 146.

In one embodiment, each of the inter-select-gate electrodes 176 laterally contacts a respective one of the inter-select-gate dielectrics 174. In one embodiment, each of the inter-select-gate electrodes 176 is laterally surrounded by a respective one of the inter-select-gate dielectrics 174. In one embodiment, the memory stack structures 55 are arranged as multiple rows of memory stack structures 55 each row of memory stack structures 55 laterally extends along a first horizontal direction hd1, and the multiple rows of memory stack structures 55 are laterally spaced apart long a second horizontal direction hd2. In one embodiment, each of the plurality of drain-select-level electrodes 146 laterally surrounds at least one row of memory stack structures 55, each of the inter-select-gate electrodes 176 does not laterally surround (i.e., does not completely laterally enclose) any of the memory stack structures 55, and each of the inter-select-gate electrodes 176 is located between a respective neighboring pair of rows of memory stack structures 55 that are laterally spaced apart along the second horizontal direction hd2.

In one embodiment, each of the inter-select-gate electrodes 176 comprises a pair of laterally-undulating sidewalls that laterally extend along a first horizontal direction hd1 and laterally undulate along a second horizontal direction hd2. In one embodiment, each of the pair of laterally-undulating sidewalls comprises: concave cylindrical sidewall segments that are laterally spaced along the first horizontal direction hd1; and planer vertical sidewall segments laterally extending along the first horizontal direction hd1 and connecting the concave cylindrical sidewall segments.

In one embodiment, each of the inter-select-gate electrodes 176 laterally extends along a first horizontal direction hd1 with undulation in width between a neighboring pair of rows of memory stack structures 55 that are arranged along a first horizontal direction hd1. In one embodiment, each of the inter-select-gate electrodes 176 comprises a pair of laterally-undulating sidewalls that extend along the first horizontal direction hd1; and each of the pair of laterally-undulating sidewalls comprises concave cylindrical sidewall segments that are interlaced with planar vertical sidewall segments. In one embodiment, each of the concave cylindrical sidewall segments is laterally spaced from a sidewall of a most proximal one of the memory stack structures 55 by a uniform thickness that is the same as a thickness of the inter-select-gate dielectrics 174.

In one embodiment, the plurality of drain-select-level electrodes 146 is located at multiple levels having different vertical separation distances from the substrate (9, 10), and each of the inter-select-gate dielectrics 174 contacts a respective vertical stack of drain-select-level electrodes 146 located at the multiple levels.

In one embodiment, a contact-level dielectric layer 80 overlies the inter-select-gate electrodes 176; and inter-select-gate electrode contact via structures 84 vertically extend through the contact-level dielectric layer 80 and contact a top surface of a respective one of the inter-select-gate electrodes 176.

In one embodiment, a pair of backside trench fill structures (74, 76) can be located on sidewalls of the alternating stack (32, 46) and the plurality of drain-select-level electrodes 146. In one embodiment, each of the pair of backside trench fill structures (74, 76) may comprises: an insulating spacer 74 in contact with the sidewalls of the alternating stacks (32, 46) and the plurality of drain-select-level electrodes 146, and optionally a backside contact via structure 76 in contact with an optional respective source region 61 embedded in the substrate (9, 10).

In one embodiment illustrated in FIG. 22, a method of operating the three-dimensional memory device includes performing a programming operation on a memory element within a selected memory stack structure 55 of the memory stack structures by activating only one of the plurality of drain-select-level electrodes 146 and deactivating all of the inter-select-gate electrodes 176, and performing an erase operation on all memory elements within the memory stack structures 55 by activating all of the plurality of drain-select-level electrodes 146 and all of the inter-select-gate electrodes 176.

The exemplary structure can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of a word-line-level electrically conductive layer 46) in a first device level of the array of monolithic three-dimensional NAND strings can be located over another memory cell (comprising another portion of the charge storage layer 54 at a level of another word-line-level electrically conductive layer 46) in a second device level of the array of monolithic three-dimensional NAND strings. The silicon substrate can contain an integrated circuit comprising a driver circuit (comprising a subset of the least one semiconductor device 700) for the memory device located thereon. The word-line-level electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion of each of the plurality of semiconductor channels (59, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 60).

The various embodiments of the present disclosure provide inter-select-gate electrodes 176 that can be employed during an erase operation to provide an additional electric field (i.e., voltage) such that an entire periphery of each vertical semiconductor channel 60 is uniformly electrically biased at the level of the drain-select-level electrodes. Gate-induced-drain-leakage (GIDL) current generation during the erase operation can uniformly occur in each of the memory stack structures 55 to provide a fast erase operation for all memory cells including the memory cells that border the drain-select-level slit trenches 173.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of word-line-isolation insulating layers and word-line-level electrically conductive layers located over a substrate;
   a plurality of drain-select-level electrode layers that are laterally spaced apart from each other overlying the alternating stack;
   memory stack structures each comprising a vertical semiconductor channel laterally surrounded by a memory film and vertically extending through the alternating stack and the plurality of drain-select-level electrode layers;
   inter-select-gate electrodes located between a respective neighboring pair of the drain-select-level electrode layers; and inter-select-gate dielectrics located between each of the inter-select-gate electrodes and a neighboring one of the drain-select-level electrode layers, wherein the inter-select-gate electrodes are not electrically connected to the drain-select-level electrode layers.

2. The three-dimensional memory device of claim 1, wherein each of the inter-select-gate electrodes laterally contacts a respective one of the inter-select-gate dielectrics.

3. The three-dimensional memory device of claim 1, wherein each of the inter-select-gate electrodes is laterally surrounded by a respective one of the inter-select-gate dielectrics.

4. The three-dimensional memory device of claim 1, wherein:
the memory stack structures are arranged as multiple rows of memory stack structures;
each row of memory stack structures laterally extends along a first horizontal direction; and
the multiple rows of memory stack structures are laterally spaced apart long a second horizontal direction.

5. The three-dimensional memory device of claim 4, wherein:
each of the plurality of drain-select-level electrode layers laterally surrounds at least one row of memory stack structures;
each of the inter-select-gate electrodes does not laterally surround any of the memory stack structures; and
each of the inter-select-gate electrodes is located between a respective neighboring pair of rows of memory stack structures that are laterally spaced apart along the second horizontal direction.

6. The three-dimensional memory device of claim 1, wherein each of the inter-select-gate electrodes comprises a pair of laterally-undulating sidewalls that laterally extend along a first horizontal direction and laterally undulate along a second horizontal direction.

7. The three-dimensional memory device of claim 6, wherein each of the pair of laterally-undulating sidewalls comprises:
concave cylindrical sidewall segments that are laterally spaced along the first horizontal direction; and
planer vertical sidewall segments laterally extending along the first horizontal direction and connecting the concave cylindrical sidewall segments.

8. The three-dimensional memory device of claim 1, wherein each of the inter-select-gate electrodes laterally extends along a first horizontal direction with undulation in width between a neighboring pair of rows of memory stack structures that are arranged along a first horizontal direction.

9. The three-dimensional memory device of claim 8, wherein:
each of the inter-select-gate electrodes comprises a pair of laterally-undulating sidewalls that extend along the first horizontal direction; and
each of the pair of laterally-undulating sidewalls comprises concave cylindrical sidewall segments that are interlaced with planar vertical sidewall segments.

10. The three-dimensional memory device of claim 9, wherein each of the concave cylindrical sidewall segments is laterally spaced from a sidewall of a most proximal one of the memory stack structures by a uniform thickness that is the same as a thickness of the inter-select-gate dielectrics.

11. The three-dimensional memory device of claim 1, wherein:
the plurality of drain-select-level electrode layers is located at multiple levels having different vertical separation distances from the substrate; and
each of the inter-select-gate dielectrics contacts a respective vertical stack of drain-select-level electrode layers located at the multiple levels.

12. The three-dimensional memory device of claim 1, further comprising:
a contact-level dielectric layer overlying the inter-select-gate electrodes; and
inter-select-gate electrode contact via structures vertically extending through the contact-level dielectric layer and contacting a top surface of a respective one of the inter-select-gate electrodes.

13. The three-dimensional memory device of claim 1, further comprising a pair of backside trench fill structures located on sidewalls of the alternating stack and the plurality of drain-select-level electrode layers.

14. A method of operating the three-dimensional memory device of claim 1, comprising:
performing a programming operation on a memory element within a selected memory stack structure of the memory stack structures by activating only one of the plurality of drain-select-level electrode layers and deactivating all of the inter-select-gate electrodes; and
performing an erase operation on all memory elements within the memory stack structures by activating all of the plurality of drain-select-level electrode layers and all of the inter-select-gate electrodes.

\* \* \* \* \*